United States Patent
Kanamitsu et al.

(10) Patent No.: US 6,490,195 B2
(45) Date of Patent: *Dec. 3, 2002

(54) SEMICONDUCTOR DEVICE, DATA PROCESSING SYSTEM AND A METHOD FOR CHANGING THRESHOLD OF A NON-VOLATILE MEMORY CELL

(75) Inventors: Michitaro Kanamitsu, Ome (JP); Tetsuya Tsujikawa, Hamura (JP); Toshinori Harada, Ome (JP); Hiroaki Kotani, Ome (JP); Shoji Kubono, Akishima (JP); Atsushi Nozoe, Hino (JP); Takayuki Yoshitake, Akishima (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/965,800

(22) Filed: Oct. 1, 2001

(65) Prior Publication Data

US 2002/0008991 A1 Jan. 24, 2002

Related U.S. Application Data

(63) Continuation of application No. 09/561,210, filed on Apr. 28, 2000, now Pat. No. 6,301,150, which is a continuation of application No. 09/317,976, filed on May 25, 1999, now Pat. No. 6,078,519.

(30) Foreign Application Priority Data

Jun. 2, 1998 (JP) .............................................. 10-152610

(51) Int. Cl.[7] ................................................ G11C 16/04

(52) U.S. Cl. ............................. 365/185.03; 365/185.18; 365/185.22

(58) Field of Search ....................... 365/185.03, 185.18, 365/185.21, 185.33, 185.22, 185.29

(56) References Cited

U.S. PATENT DOCUMENTS

| 5,870,218 A | 2/1999 | Jyouno et al. ......... 365/185.03 |
| 6,052,303 A | * 4/2000 | Chevallier et al. ...... 365/185.03 |
| 6,078,519 A | * 6/2000 | Kanamitsu et al. ..... 365/185.03 |

FOREIGN PATENT DOCUMENTS

JP        9-297996       11/1997

OTHER PUBLICATIONS

"Flash Memory, Strategy to be Reshaped", *Nikkei Microdevice*, Nov. 1994, pp. 48–49.

* cited by examiner

*Primary Examiner*—David Lam
(74) *Attorney, Agent, or Firm*—Antonelli, Terry, Stout, & Kraus, LLP

(57) ABSTRACT

Data are generated based on additional write data input to data latch circuits (DLR and DLL) and data read from memory cells (MC) to program non-volatile memory cells in a write state into the same write state and to program non-volatile memory cells in an erase state into a write state indicated by the additional write data. The generated data are latched in the data latch circuits to perform a logical synthesis process for additional writing. Even after the additional write operation, the logically synthesized data remain in the data latch circuits, and the latched data can be reused against abnormality in writing. This eliminates the need for receiving write data again from the outside when the additional write operation is to be retried.

8 Claims, 34 Drawing Sheets

| OPERATION MODE | COMMAND |
|---|---|
| READ | 00H |
| WRITE | 1FH |
| ADDITIONAL WRITE | 10H |
| ERASE | 20H |

| | NAME | DEFINITION |
|---|---|---|
| I/O7 | Ready/$\overline{\text{Busy}}$ | "$V_{OH}$"=Ready  "$V_{OL}$"=Busy |
| I/O6 | Reserved | |
| I/O5 | Erase Check | "$V_{OH}$"=Fail  "$V_{OL}$"=Pass |
| I/O4 | Program Check | "$V_{OH}$"=Fail  "$V_{OL}$"=Pass |
| I/O3 | Reserved | |
| I/O2 | Reserved | |
| I/O1 | Reserved | |
| I/O0 | Reserved | |

STATUS REGISTER

| WRITE DATA | I/O 4 | I/O 0 | DLL | DLR |
|---|---|---|---|---|
| 01 | 0 | 1 | 0 | 1 |
| 00 | 0 | 0 | 0 | 0 |
| 10 | 1 | 0 | 1 | 0 |
| 11 | 1 | 1 | 1 | 1 |

INPUT DATA

OPERATION VOLTAGE

FIG. 12

| | SELECTED BLOCK | | NON-SELECTED BLOCK | |
|---|---|---|---|---|
| | SELECTED WORD | UNSELECTED WORD | SELECTED WORD | UNSELECTED WORD |
| READ | 2.4/3.2/4.0V<br>1.0V — Vss<br>Vss | Vss<br>1.0V — Vss<br>Vss | Vss<br>OPEN — OPEN<br>Vss | Vss<br>OPEN — OPEN<br>Vss |
| ERASE | −16V<br>2.0V — 2.0V<br>2.0V | Vss<br>2.0V — 2.0V<br>2.0V | 2.0V<br>2.0V — 2.0V<br>2.0V | 2.0V<br>2.0V — 2.0V<br>2.0V |
| WRITE / WRITE DATA | 15.1/15.8/17.0V<br>Vss — OPEN<br>Vss | 4.5V<br>Vss — Vss<br>Vss | OPEN<br>OPEN — OPEN<br>Vss | Vss<br>OPEN — OPEN<br>Vss |
| WRITE / NON-WRITE DATA | 15.1/15.8/17.0V<br>6.0V — OPEN<br>Vss | 4.5V<br>6.0V — Vss<br>Vss | OPEN<br>OPEN — OPEN<br>Vss | Vss<br>OPEN — OPEN<br>Vss |
| WRITE / VERIFY | 2.8/3.6/4.5V<br>1.0V — Vss<br>Vss | Vss<br>1.0V — Vss<br>Vss | Vss<br>OPEN — OPEN<br>Vss | Vss<br>OPEN — OPEN<br>Vss |
| WRITE / ERRATIC DETECTION DISTURB DETECTION | 2.3V/3.1/3.9V<br>1.0V — Vss<br>Vss | Vss<br>1.0V — Vss<br>Vss | Vss<br>OPEN — OPEN<br>Vss | Vss<br>OPEN — OPEN<br>Vss |

'01' WRITE

'00' WRITE

'10' WRITE

ERRATIC/DISTURB DETECTION

BEFORE ADDITIONAL WRITE

REERASE

FLOW OF ERASURE

FIG. 21

| DATA LATCH PROCESS | CONTENTS OF CALCULATIONS (SENSE LATCH DATA AT SELECTED MAT ) |
|---|---|
| "01" WRITE DATA | $A+\bar{B}$ |
| "00" WRITE DATA | $A+B$ |
| "10" WRITE DATA | $\bar{A}+B$ |
| "00" ERRATIC DETECTION DATA | $\overline{A+B}$ |
| "10" ERRATIC DETECTION DATA | $A \cdot \bar{B}$ |
| "11" DISTURB DETECTION DATA | $A \cdot B$ |

A : UPPER DATA   B : LOWER DATA

FIG. 22

| A UPPER | B LOWER | $A+\bar{B}$ | $A+B$ | $\bar{A}+B$ | $\overline{A+B}$ | $A \cdot \bar{B}$ | $A \cdot B$ |
|---|---|---|---|---|---|---|---|
| 0 | 1 | 0 | 1 | 1 | 0 | 0 | 0 |
| 0 | 0 | 1 | 0 | 1 | 1 | 0 | 0 |
| 1 | 0 | 1 | 1 | 0 | 0 | 1 | 0 |
| 1 | 1 | 1 | 1 | 1 | 0 | 0 | 1 |

(AFTER ADDITIONAL WRITE)
CONCEPT OF ADDITIONAL WRITE

FIG. 24

LOWER BIT: $a0 \cdot \overline{(b1 \oplus b3)}$
UPPER BIT: $\overline{a1} \oplus \overline{b2}$

- a0 : ADDITIONAL WRITE DATA (LOWER BIT)
- a1 : ADDITIONAL WRITE DATA (UPPER BIT)
- b1 : MEMORY READ DATA (VRW 1 (2.4V) READ)
- b2 : MEMORY READ DATA (VRW 2 (3.2V) READ)
- b3 : MEMORY READ DATA (VRW 3 (4.0V) READ)
- $\oplus$ : EXCLUSIVE OR

| STATE OF MEMORY CELL | ADDITIONAL WRITE DATA | a1 | a0 | b1 | b2 | b3 |
|---|---|---|---|---|---|---|
| 01 | 11 | 1 | 1 | 1 | 1 | 1 |
| 00 | 11 | 1 | 1 | 1 | 1 | 0 |
| 10 | 11 | 1 | 1 | 1 | 0 | 0 |
| 11 | 01 | 0 | 1 | 0 | 0 | 0 |
| 11 | 00 | 0 | 0 | 0 | 0 | 0 |
| 11 | 10 | 1 | 0 | 0 | 0 | 0 |
| 11 | 11 | 1 | 1 | 0 | 0 | 0 |

FIG. 26

| READ SEQUENCE | | | | | | | | | | | | |
|---|---|---|---|---|---|---|---|---|---|---|---|---|
| Step | \multicolumn{6}{c}{VRW1 READ} | \multicolumn{6}{c}{VRW2 READ} |
| | \multicolumn{6}{c}{Step 1} | \multicolumn{6}{c}{Step 2} |

(table continues — see figure)

Figure 30:
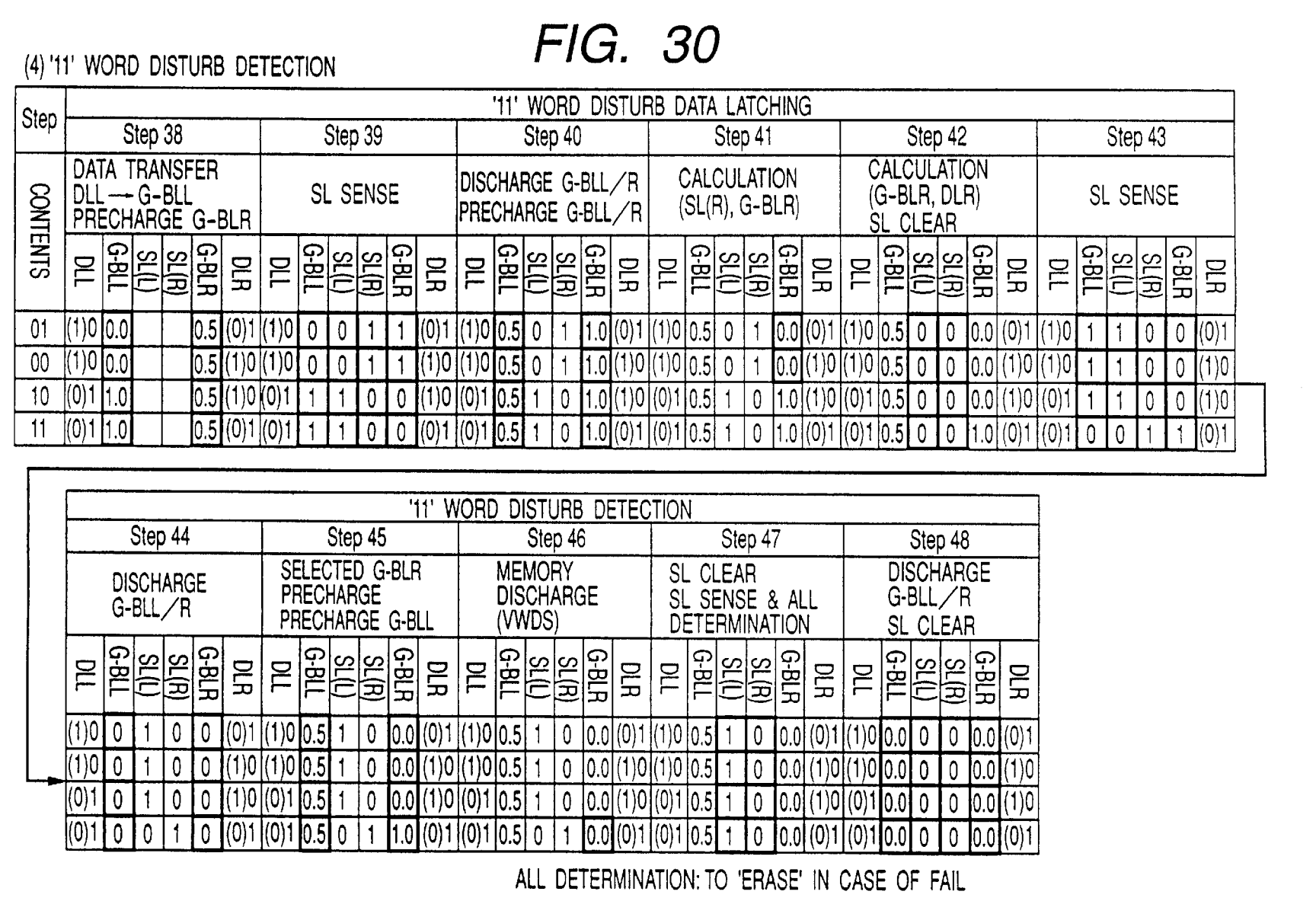

(4) '11' WORD DISTURB DETECTION

'11' WORD DISTURB DATA LATCHING / '11' WORD DISTURB DETECTION

ALL DETERMINATION: TO 'ERASE' IN CASE OF FAIL

(6) '00' ERRATIC DETECTION

FIG. 35

2. ERASE SEQUENCE

| Step | ERASE VERIFY 1 | | | |
|---|---|---|---|---|
| | Step 1 | Step 2 | Step 3 | Step 4 |
| CONTENTS | G-BLL/R PRECHARGE | MEMORY DISCHARGE (VEV=2.0V) | SL SENSE & ALL DETERMINATION | G-BLL/R DISCHARGE, SL CLEAR |
| | DLL \| G-BLL \| SL(L) \| SL(R) \| G-BLR \| DLR | DLL \| G-BLL \| SL(L) \| SL(R) \| G-BLR \| DLR | DLL \| G-BLL \| SL(L) \| SL(R) \| G-BLR \| DLR | DLL \| G-BLL \| SL(L) \| SL(R) \| G-BLR \| DLR |
| 11 | 0.5 \| \| \| 1.0 \| | 0.5 \| \| \| 1.0 \| | 0 \| 0 \| 1 \| 1 \| | 0 \| 0 \| 0 \| 0 \| |
| ≧11, ≦11 | 0.5 \| \| \| 1.0 \| | 0.5 \| \| \| 1.0 \| | 0 \| 0 \| 1 \| 1 \| | 0 \| 0 \| 0 \| 0 \| |

※ 11: BITS WHOSE Vth IS 'VEV OR' LESS
≦11: BITS WHOSE Vth IS 'VWV0 OR' LESS (BITS TO BE REWRITTEN)

ALL DETERMINATION: ERASE TERMINATES IN CASE OF PASS

| ERASE | ERASE VERIFY 2 | | | |
|---|---|---|---|---|
| Step 5 | Step 6 | Step 7 | Step 8 | |
| ERASE | G-BLL/R PRECHARGE | MEMORY DISCHARGE (VEV=2.0V) | SL SENSE & ALL DETERMINATION | |
| | 0.5 \| 1.0 | 0.5 \| 0.0 | 1 \| 1 \| 0 \| 0 | |
| | 0.5 \| 1.0 | 0.5 \| 0.0 | 1 \| 1 \| 0 \| 0 | |

ALL DETERMINATION: TO STEP 5 IN CASE OF FAIL

| '11' ERRATIC DETECTION | | | |
|---|---|---|---|
| Step 9 | Step 10 | Step 11 | Step 12 |
| G-BLL/R DISCHARGE, SL CLEAR | G-BLL/R PRECHARGE | MEMORY DISCHARGE (VWV0=1.2V) | SL SENSE & ALL DETERMINATION |
| 0 \| 0 \| 0 \| 0 | 0.5 \| 1.0 | 0.5 \| 1.0 | 0 \| 0 \| 1 \| 1 |
| 0 \| 0 \| 0 \| 0 | 0.5 \| 1.0 | 0.5 \| 0.0 | 1 \| 1 \| 0 \| 0 |

(a) ALL DETERMINATION: ERASE TERMINATES IN CASE OF PASS

| WRITE (DEPLETE PREVENTING PROCESS) | | | |
|---|---|---|---|
| Step 13 | Step 14 | Step 15 | Step 16 |
| WRITE | G-BLL/R DISCHARGE G-BLL/R PRECHARGE | MEMORY DISCHARGE (VWV0=1.2V) | SL CLEAR, SL SENSE & ALL DETERMINATION |
| 0.0 \| 0.0 \| 6.0 \| 6.0 | 0.5 \| 0 \| 1 \| 1.0 | 0.5 \| 0 \| 1 \| 1.0 | 0 \| 0 \| 1 \| 1 |
| 6.0 \| 6.0 \| 0.0 \| 0.0 | 0.5 \| 1 \| 0 \| 1.0 | 0.5 \| 1 \| 0 \| 1.0 | 0 \| 0 \| 1 \| 1 |

ALL DETERMINATION: TO STEP 13 IN CASE OF FAIL

| '11' ERRATIC DETECTION | | | |
|---|---|---|---|
| Step 17 | Step 18 | Step 19 | Step 20 |
| G-BLL/R PRECHARGE | MEMORY DISCHARGE (VWDS) | SL SENSE & ALL DETERMINATION | G-BLL/R DISCHARGE, SL CLEAR |
| 0.5 \| 1.0 | 0.5 \| 0.0 | 1 \| 1 \| 0 \| 0 | 0 \| 0 \| 0 \| 0 |
| 0.5 \| 1.0 | 0.5 \| 0.0 | 1 \| 1 \| 0 \| 0 | 0 \| 0 \| 0 \| 0 |

ALL DETERMINATION: ERASE TERMINATES IN CASE OF PASS

SEMICONDUCTOR DEVICE, DATA PROCESSING SYSTEM AND A METHOD FOR CHANGING THRESHOLD OF A NON-VOLATILE MEMORY CELL

CROSS-REFERENCE TO RELATED APPLICATION

This application is a continuation of application Ser. No. 09/561,210, filed Apr. 28, 2000, which is a continuation of application Ser. No. 09/317,976, filed on May 25, 1999, now U.S. Pat. No. 6,078,519, the entire disclosure of which is hereby incorporated by reference.

BACKGROUND OF THE INVENTION

The present invention relates to a semiconductor device having a non-volatile memory cell which can be electrically erased and written; and, more particularly, the invention relates to a non-volatile semimconductor storage device, such as a flash memory, in which a threshold voltage associated with multiple-valued information comprising four values or more can be programmed in one memory cell and to a method for changing a threshold of a non-volatile cell memory. For example, the invention relates to a technique which is effectively used in a data processing system, such as a file memory system utilizing such a non-volatile semiconductor storage device.

Non-volatile semiconductor storage devices, e.g., flash memories, have been provided which can store imformation through injection and extraction of electrons to and from a floating gate. A flash memory includes a memory cell transistor having a floating gate, a control gate, a source and a drain. The threshold voltage of such a memory cell transistor increases as electrons are injected into the floating gate and decreases as electrons are extracted from the floating gate. The memory cell transistor stores information that depends on whether the threshold voltage is higher or lower than a word line voltage (a voltage applied to the control gate) for data readout. In this specification, a state in which the threshold voltage is lower is referred to as an "erase state" and a state in which it higher is referred to as a "write state", although this is not a limitation of the invention.

There are flash memories of this type in which information comprising four or more values is stored in one memory cell transistor. An example of articles that describe such multiple-valued memories appears on pages 48 and 49 of "Nikkei Microdevice" (November, 1994 issue). Another example is Japanese Patent Laid-Open No. 297996/1997.

SUMMARY OF THE INVENTION

In a multiple-valued memory, for example, information comprising four values can be stored in one memory cell transistor by allowing selection of one state from among an erase state and first, second and third write states whose threshold voltages relative to that of the erase state are different from each other. When an erase operation precedes a write operation, information comprising four values can be stored by selecting none of the first, second and third write states or selecting any one of the write states. During a write operation for this purpose, write control information is necessary to determine whether to select a write operation to achieve one of the first, second or third write states. Such write control information can be maintained using a sense latch circuit and a data latch circuit provided for each bit line.

For example, the sense latch circuit comprises a static latch; one end of a bit line is connected to each of a pair of input and output terminals of the sense latch circuit; and the drain of the memory cell transistor is connected to each bit line. Further, the data latch circuit is connected to the other end of each bit line. The sense latch circuit senses whether a current flows or not between the source and drain of the memory cell transistor when a read voltage or a verify voltage is applied to the control gate of the same. Bit lines at the non-operation selection side of the sense-latch circuit are precharged at a reference level. When a high potential difference is formed between the control gate and the drain, it is possible to identify whether each memory cell is selected or not for writing by increasing or decreasing the drain voltage of the memory cell. In this case, the sense latch circuit latches data depending on the whether a write operation is selected or not. This latch data is the write control information described above.

Such write control information is generated by a data conversion circuit for every two bits of write data supplied externally and is latched in the sense latch circuits for bit lines selected to be written and the data latch circuits for each of the pairs of bit lines that share the sense latch circuit. When a write operation is performed on each word line, write control information is latched in advance in the sense latch circuits and data latch circuits for all bit lines that share the word line.

During a write operation, it is first determined whether the first write state is present or not according to write control information latched in a sense latch circuit. Next, it is determined whether the second write state is present or not according to write control information transferred internally from one of the data latch circuits to the sense latch circuit. Further, it is determined whether the third write state is present or not according to write control information transferred internally from the other data latch circuit to the sense latch circuit. Thus, four-valued information identified by two bits of data can be stored in one memory cell. During the write operation in the first, second and third write states described above, a verify operation is performed to check whether a threshold voltage assigned to each of the write states has been reached or not.

At this time, some memory cells may be overwritten relative to the first, second or third write state, and, in an overwrite state, the threshold voltage may not be distinguished from other write states. For example, the threshold voltage of a memory cell which should be in the first write state can be increased to a level at which it can not be distinguished from the threshold voltage in the second write state. In such a case, the write operation is redone from the beginning by performing the write operation again after performing an erase operation on the memory cells which are to be written.

However, once a write operation is performed in the first, second or third write state, the write control information latched in the sense latch circuit is overwritten and erased by another piece of write control information transferred internally from a data latch circuit. Therefore, in order to perform a rewrite operation attributable to overwrite, the same write data must be received from the outside again. For this reason, a control circuit that controls access to a flash memory must maintain write data in a work memory or the like for a certain period of time after the write operation to the flash memory. The inventors have discovered that this increases the burdens associated with the control over access to a flash memory and can therefore reduce the efficiency of flash memory access or data processing.

The above-described situation similarly occurs in the case of additional writing. For example, a flash memory is used for a file memory system or the like which is compatible with a file system based on a magnetic disc storage device, such as a hard disc device. In this case, a part of the storage area of a flash memory is assigned to a management area which is separate from a user area. In a flash memory that accommodates write and erase on a word line basis, memory cells for one word line (hereinafter simply referred to as "sector") are assigned to a user area and a management area, and the management area stores information on the validity of the user area of the associated sector and information on the number of rewrites. It may be required to perform the storage of such information separately from the rewrite of user data in a sector because of the nature of the information. Additional writing is a mode of a write operation that can meet such a requirement.

In the case of an additional write operation, additional write data is supplied to memory cells selected for writing. Since the write operation is performed sector by sector, it is necessary to save the data in memory cells which are unselected for writing, and both of the saved data and the additional write data must be written in the write operation.

However, the write operation must be redone from the beginning also in this case if an overwrite state or the like occurs. In doing so, if data for rewrite is to be supplied again externally, the control circuit controlling access to the flash memory must maintain the data for rewrite for a certain period of time after the additional write operation on the flash memory just as in the case of a write operation as described above. This increases the burdens associated with control over access to the flash memory and can reduce the efficiency of access to the flash memory or data processing.

The inventors also studied a write verify operation on a flash memory. During a write operation, the threshold voltage is gradually varied while repeating application of a high write voltage and verification. When it is determined that the threshold voltage of a memory cell has reached a target value in the course of such an operation, write voltage disabling information is latched in the sense latches of the bit lines connected to the memory cell, and, thereafter, the write voltage will never be applied to the memory cell once determined to have reached the write threshold voltage. At the initial stage of a write operation, however, since most memory cells have not reached a required write threshold voltage, a high current flows to the sources of the memory cells during write verification to increase the apparent threshold. Therefore, some of memory cells which have passed a verify operation at the initial stage of a write operation may not have reached a required write threshold voltage. In such a case, problems can arise in the configuration in which the write voltage can never be applied to the memory cells once determined to have reached the write threshold voltage.

The inventors have also studied an erase operation. As a result, it was found that it is important to make the distribution of the threshold voltages of memory cells in an erase state as uniform as possible when consideration is given to the efficiency of a write operation that follows an erase operation or the reliability of the written data.

It is an object of the invention to provide a semiconductor device in which it is possible to prevent additional write data supplied externally or data read out from memory cells to be saved from being lost each time an additional write operation is performed It is another object of the invention to provide a semiconductor device which does not need to receive additional write data supplied from outside again to repeat an additional write operation.

It is still another object of the invention to provide a semiconductor device in which the reliability of a write verify operation can be improved by a verify operation which is performed even when a write verify operation has once resulted in a determination that an anticipated threshold voltage has been reached.

It is another object of the invention to provide a semiconductor device in which the distribution of threshold voltages of memory cells in an erase state can be made uniform.

It is another object of the invention to provide a method of changing a threshold of a non-volatile memory cell.

The above and other objects and novel features of the present invention will be apparent from the description provided in this specification and from the accompanying drawings.

Typical aspects of the invention disclosed in this specification can be briefly summarized as follows.

(1) According to a first aspect of the invention, there is provided a semiconductor device (1) to which additional write data are input (WS3) to perform an additional write operation through a process of logically synthesizing data read from memory cells and the additional write data (WS4), bulk erasure (WS5) and writes (RS1 through TS4) and a method for changing a threshold of the same. Memory cells of this semiconductor device may store either binary information or multi-valued information.

More specifically, the semiconductor device comprises bit lines (G-BLR and G-BLL) to which a plurality of electrically erasable and writable non-volatile memory cells (MC), a sense latch circuit (SL) and data latch circuits (DLR and DLL) are connected and control means (18) for latching information read from the non-volatile memory cells through the sense latch circuit in the data latch circuits and for controlling a write operation on the non-volatile memory cells based on data latched in the data latch circuits. The control means inputs additional write data in the data latch circuits. It performs a logical synthesis process based on the input additional write data and data read from the memory cells to obtain data for programming non-volatile memory cells in a write state into the same write state and for programming non-volatile memory cells in an erase state into a write state which is indicated by the additional write data. It latches the data obtained by the logical synthesis process in the data latch circuits and performs writing to the non-volatile memory cells in accordance with the latched data. Thus, the additional write operation can be performed with theologically synthesized data latched in the data latch circuits. Specifically, the logically synthesized data are latched in the data latch circuits; it is determined at each of a plurality of steps of a write operation to which of multi-valued threshold voltages the latched data correspond so as to latch write control information as a result of the determination in the sense latch circuit; and a write operation having multiple steps is performed to set the multi-valued threshold voltages in the memory cells in accordance with the write control information latched in the sense latch circuit.

Therefore, logically synthesized data will remain in the data latch circuits even after completion of the additional write operation. By maintaining the data of the result of the logical synthesis process in the data latch circuits until the write operation is completed, the latched data can be reused against abnormal writing to eliminate the need for receiving the write data again from the outside when the additional write operation is performed again. Therefore, a control circuit that controls access to the, semiconductor device is not required to hold write data in a work memory or the like for a certain period of title after a write operation on the semiconductor device. This makes it possible to improve the efficiency of memory access and data processing associated with memory access of the semiconductor device.

After the data obtained by the logical synthesis process are latched in the data latch circuits, a write operation on non-volatile memory cells in accordance with the data as a result of the logical synthesis process latched in the data latch circuits can be preceded by an erase operation (erase back or weak erase) performed on the non-volatile memory cells to be written. Thus, even in the case of additional writing, the memory cells are substantially put in an erase state immediately before the additional writing. This makes it possible to eliminate restrictions on the number of additional writes within the range of endurance to rewriting, thereby improving the reliability of additionally written data.

A semiconductor device in which, specifically, said means is specialized for storage of information having four or more values, comprises:

a sense latch circuit having a pair of input/output terminals;

a bit line provided in association with each of the input/output terminals of the sense latch circuit;

a plurality of electrically erasable and writable non-volatile memory cells connected to the bit line;

a plurality of data latch circuits connected to the bit line;

control means for latching information read from the non-volatile memory cells through the sense latch circuit in accordance with a threshold voltage state programmed in the non-volatile memory cells in the plurality of data latch circuits as multi-valued information having four or more values and for programming a threshold voltage state for writing in the non-volatile memory cells based on the multi-valued information latched in the plurality of data latch circuits. The control means inputs additional write data as multi-valued information in the data latch circuits, then performs a logical synthesis process based on the input additional write data and the multi-valued information read from the non-volatile memory cells to obtain multi-valued information for programming non-volatile memory cells having a threshold voltage state for writing into the same threshold voltage state for writing and for programming non-volatile memory cells having a threshold voltage state for erasure into a threshold voltage state for writing which is indicated by the additional write data, latches the multi-valued information obtained by the logical synthesis process in the data latch circuits and programs the threshold voltage state of the non-volatile memory cells in accordance with the latched multi-valued information.

[2] According to a second aspect of the inventions write verify operation is performed each time using data latched in the data latch circuits (DLR and DLL) which primitively latch write data whether the data are multi-valued or binary. Specifically, a semiconductor device comprises:

a bit line to which a plurality of electrically erasable and writable non-volatile memory cells are connected;

a sense latch circuit and a data latch circuit connected to the bit line; and control means (18) for latching information read from the non-volatile memory cells through the sense latch circuit in the data latch circuit and for controlling a write operation on the non-volatile memory cells sector by sector as a unit for writing based on the data latched in the data latch circuit. The control means applies a write voltage to non-volatile memory cells selected for writing in a sector to be written using the data latched in the data latch circuit at the time of a write operation (WS11) and determines whether the threshold voltage state has reached a target threshold voltage state as a result of the application of the write voltage using data latched in the data latch circuit at each process of applying the write voltage (WS12 and WS13).

According to this, the write verify operation is performed each time using data stored in the data latch circuit. As a result, even when a write verify operation provides an erroneous determination that a desired threshold voltage has been reached at the initial stage of writing or the like, the failure can be checked to allow rewriting.

The execution of an erratic/disturb detection operation after writing makes it possible to detect any abnormality in a threshold voltage distribution attributable to writing.

When multi-valued information is stored in the non-volatile memory cells, erratic/disturb detection first detects word disturbances that result in overwrite failures with high probability. This makes it possible to reduce the processing time spent before the detection of any failure.

[3] According to a third aspect of the invention write back is performed on memory cells in an over-erased state to prevent depletion after erasure whether the data is multi-valued or binary (selective writing is performed in memory cells whose threshold voltage is at a predetermined voltage or less) to keep memory cells in an erased state at threshold voltages equal to or higher than a predetermined voltage. Further, disturb detection is performed after the write back to prevent depletion to detect abnormal threshold voltages. These features make it possible to provide memory cells in an erase state with a uniform threshold voltage distribution.

An erase verify operation is performed prior to erasure to erase only sectors which fail the verification. This makes it possible to eliminate waste of time associated with an erase operation.

[4] For example, the semiconductor devices may be semiconductor memories formed on a single semiconductor substrate, such as flash memories or microcomputers, microprocessors and the like having an on-chip flash memory. The flash memory in the form of a semiconductor memory makes it possible to configure data processing systems such as non-volatile memory cards as PC (personal computer) cards. Such a data processing system includes, on a card substrate thereof, a semiconductor device in the form of a flash memory, access control means for controlling access to the semiconductor device and interface means for allowing the access control means to be interfaced to the outside of the system.

BRIEF DESCRIPTION OF THE DRAWINGS

FIG. 12 is a table which collectively illustrates various voltage conditions for various operational modes of the flash memory.

FIG. 21 is a table showing a logical illustration of examples of the contents of calculations at a data latching process included in a write operation and the like.

FIG. 22 is a table which illustrates logical values as a result of calculations on the logical values of data bits A and B using the arithmetic logic shown in FIG. 21.

FIG. 24 is a table which shows the contents of write data for lower bits and upper bits obtained by a logic synthesis process included in an additional write operation in the form of logical expressions.

FIG. 26 is a diagram providing a diagram providing a detailed illustration of a flash memory read operation.

FIG. 27 is a diagram providing a detailed illustration of a "01" write operation.

FIG. 28 is a diagram providing a detailed illustration of a "00" write operation.

FIG. 29 is a diagram providing a detailed illustration of a "10" write operation.

FIG. 30 is a diagram providing a detailed illustration of a "11" word disturb detection process.

FIG. 31 is a diagram providing a detailed illustration of a "10" erratic detection process.

FIG. 32 is a diagram providing a detailed illustration of a "00" erratic detection process.

FIG. 35 is a diagram providing a detailed illustration of an erase operation.

DESCRIPTION OF THE PREFERRED EMBODIMENTS

[General Configuration of Flash Memory]

Figure 2:
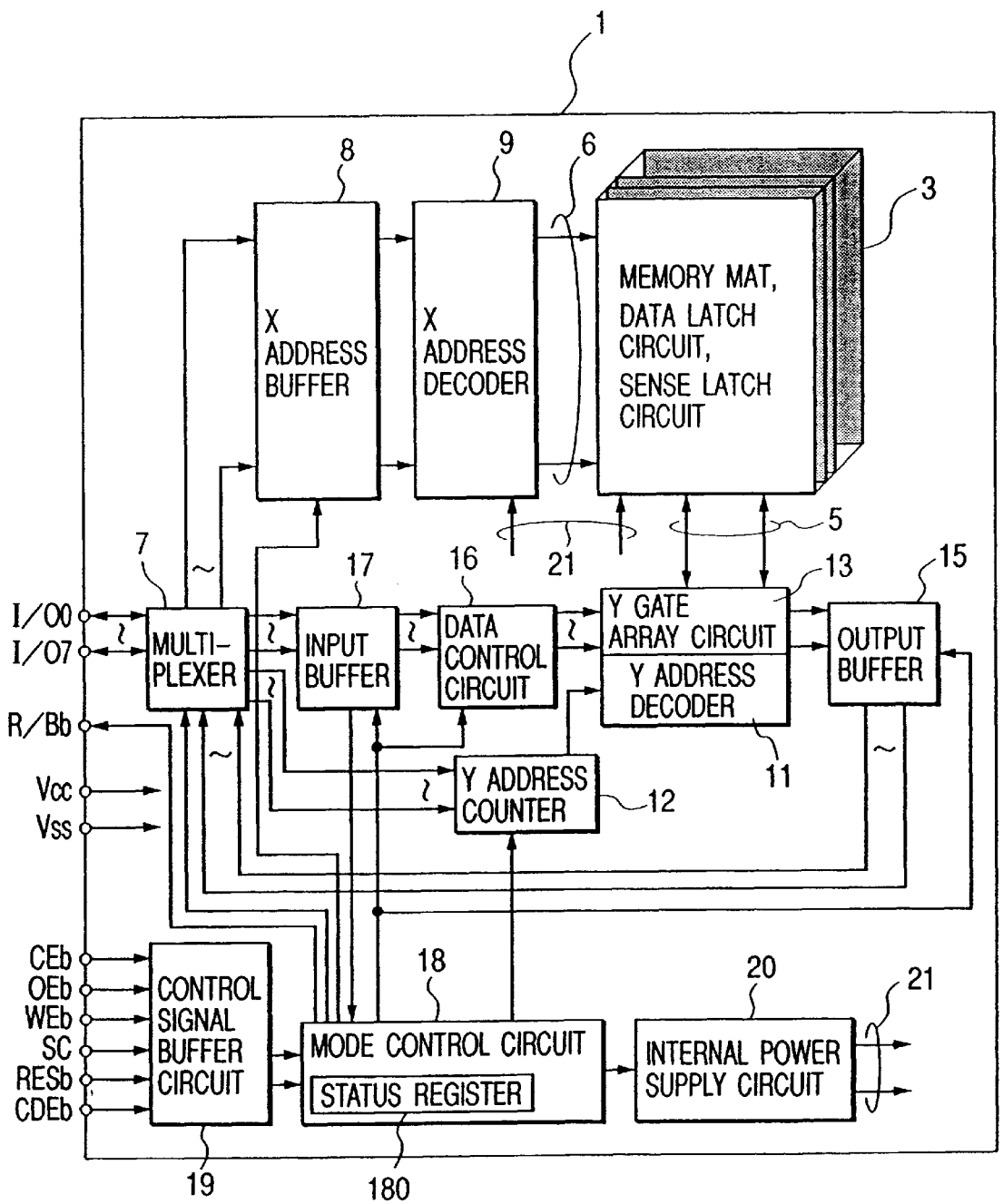
FIG. 2 is a block diagram illustrating a general configuration of the four-valued flash memory according to the embodiment of the invention.

FIG. 2 shows a general block diagram of a flash memory according to an embodiment of the present invention. The flash memory 1 illustrated is a four-valued flash memory in which two bits of information is stored in one memory cell.

Figures 3, 4:
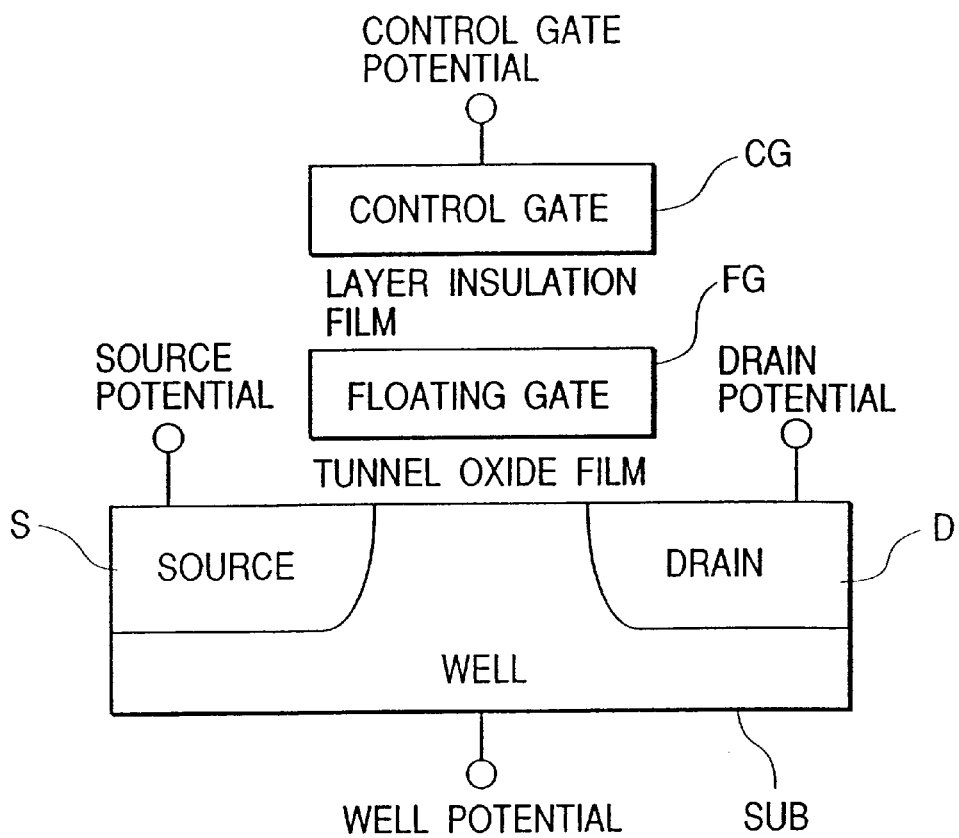
FIG. 3 is a vertical sectional view schematically illustrating a device structure of a memory cell transistor used in the flash memory.
FIG. 4 is a table which illustrates examples of commands to the flash memory.

A memory array 3 in FIG. 2 includes a memory mat, data latch circuits and a sense latch circuit. The memory mat includes a number of non-volatile memory cell transistors which can be electrically erased and written. For example, as shown in FIG. 3, the memory cell transistor (also referred to as "flash memory cells") comprises a source S and a drain D formed in a semiconductor substrate or a well SUB, a floating gate FG formed in a channel region between the source S and drain D with a tunnel oxide film interposed therebetween and a control gate CG overlaid on the floating gate FG with a layer insulation film interposed therebetween. The control gate CG, drain D and source S are respectively connected to a word line 6, a bit line 5 and a source line which is not shown.

External input/output terminals I/O0 through I/O7 of the flash memory 1 also serve as address input terminals, data input terminals, data output terminals and command input terminals. X address signals input through the external input/output terminals I/O0 through I/O7 are supplied through a multiplexer 7 to an X address buffer 8. An X address decoder 9 decodes internal complementary address siqnals output by the X address buffer 8 to drive the word lines.

A sense latch circuit (SL) to be described later is connected to one end of a bit line 5, and data latch circuits (DLL, DLR) to be also described later are connected to the other end. The bit lines 5 are selected by a Y gate array circuit 13 based on a selection signal output by a Y address decoder 11. A Y address signal input through the external input/output terminals I/O0 through I/O7 is preset in a Y address counter 12, and address signals which are sequential increments from the preset value as a starting point are supplied to the Y address decoder 11.

Bit lines selected by the Y gate array circuit 13 are in conduction to an input terminal of an output buffer 15 during a data output operation and are in conduction to an output terminal of a data control circuit 16 through an input buffer 17 during a data input operation. The connection of the output buffer 15 and input buffer 17 to the input/output terminals I/O0 through I/O7 is controlled by the multiplexer 7. Commands' .supplied'through the input/output terminals I/O0 through I/O7 are supplied to a mode control cir@u,it 18 through the multiplexer 7 and input buffer 17.

A control signal buffer circuit 19 is supplied with access control signals, i.e., a chip enable signal CEb, an output enable signal OEb, a write enable signal WEb, a serial clock signal SC, a reset signal RESB and a command enable signal CDEB. The mode control circuit 18 controls functions such as an interface with external signals in accordance with the state of those signals and controls internal operations in accordance with input commands. when a command or data is input to the input/output terminals I/O0 through I/O7, the signal CDEb is asserted. If a command is input, the signal WEb is asserted further, and if data is input, the signal WEb is negated. If an address is input, the signal CDEb is negated, and the signal WEb is asserted. Thus, the mode control circuit 18 can distinguish commands, data and addresses input through the external input/output terminals I/O0 through I/O7 on a multiplex basis. The mode control circuit 18 can assert a ready/busy signal R/Bb during an erase or write operation to communicate such a state externally.

An internal power supply circuit (internal voltage generation circuit) 20 generates operating power supplies 21 that serve as various interval voltages for writing, erasing, verification and reading and supplies them to the address decoder 9 and memory cell array 3.

The mode control circuit 18 controls the flash memory 1 as a whole in accordance with input commands. The operation of the flash memory 1 is basically determined by the commands. For example, the commands for the flash memory include read, erase, write and additional write commands as shown in FIG. 4. In FIG. 4, command codes are expressed in the hexadecimal notation which is indicated by a symbol H.

Figures 5, 7, 8:
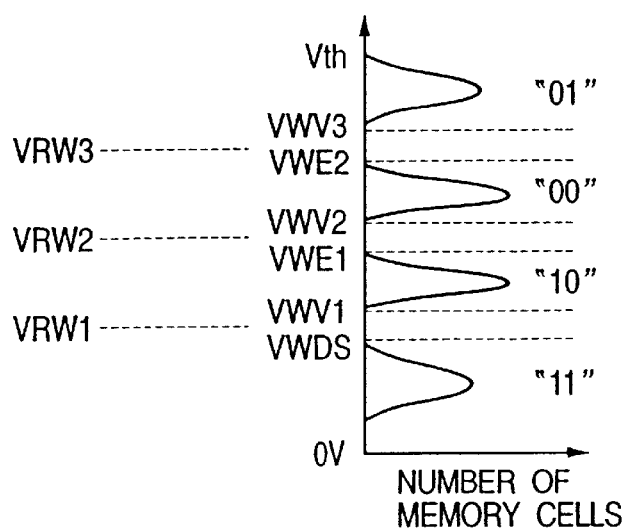
FIG. 5 is a table which illustrates an example of association between the contents of the bits of a status register and input/output terminals I/O0 through I/O7.
FIG. 7 is a table which illustrates an example of association between the contents of the data latch circuits and input/output terminals I/O0 through I/O7.
FIG. 8 is a diagram which illustrates the relationship between data in four values and threshold voltages of memory cell transistors in the form of a threshold voltage distribution diagram.

The flash memory 1 has a status register 180 to indicate the internal state thereof, and the contents of the same can be read through the input/output terminals I/O0 through I/O7 by asserting the signal OEb. FIG. 5 shows an example of the correspondence between the contents of the bits of the status register 180 and the input/output terminals I/O0 through I/O7.

Figure 6:
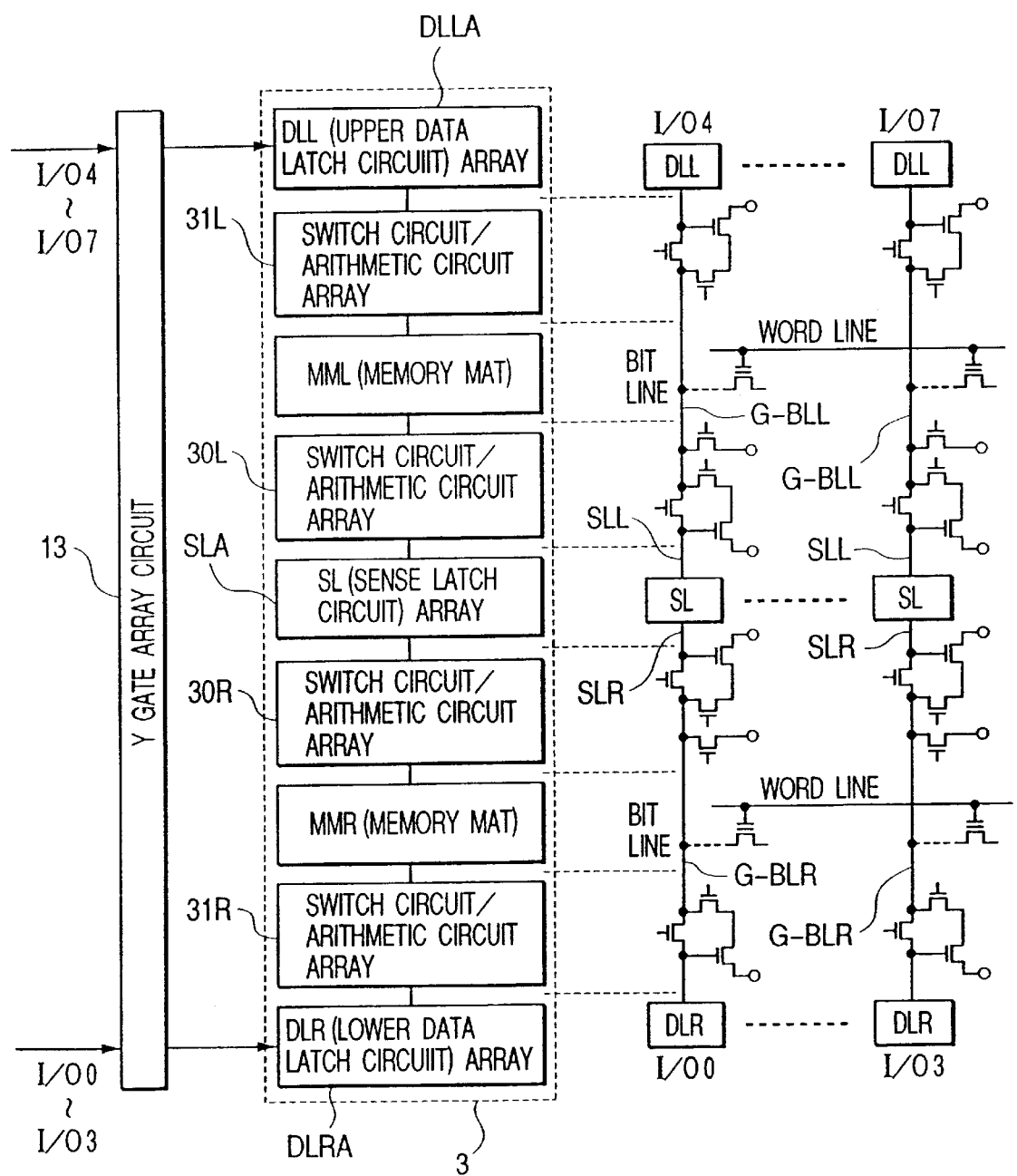
FIG. 6 is a schematic diagram which shows an example of the connection between data latch circuits, bit lines and a sense latch circuit included in a memory array of the four-valued flash memory.

FIG. 6 shows the relationship between the data latch circuits and sense latch circuits included in the memory array 3. An array SLA of sense latch circuits SL is provided in the middle and a switch circuit/arithmetic circuit array 30L, a memory mat MML, a switch circuit/arithmetic circuit array 31L and an array DLLA of upper data latch circuits DLL are provided at input/output nodes SLL at one side of the sense latch circuit SL. Similarly, a switch circuit/ arithmetic circuit array 30R, a memory mat MMR, a switch circuit/arithmetic circuit array 31R and an array DLRA of low data latch circuits DLR are provided at input/output nodes SLR at the other side of the sense latch circuit SL. The configuration will be understood by bringing a pair of bit lines in FIG. 6 into focus. Specifically, data latch circuits DLL and DLR are provided at a pair of data input/output nodes SLL and SLR through bit lines G-BLL and G-BLR of a static latch type sense latch circuit SL. The data latch circuits DLL and DLR can latch write data bits supplied through the Y gate array circuit 13. In this example, since the flash memory 1 has 8-bit input/output terminals I/O0 through I/O7, write data can be set in the data latch circuits DLL and DLR for four pairs of bit lines at one cycle in the input of write data. Data are set in a predetermined mode which is represented by the association between the data latch circuits DDL and DLR and the pair of input/output terminals I/O4 and I/O0 shown in FIG. 7. In the context of the description, since writing is performed on a word line by word line basis, a write operation is performed by applying a write voltage after write data are set in the data latch circuits DLL and DLR associated with the bit lines of all memory cells whose selection terminals are connected to one word line. The input/output terminals I/O5 and I/O1, I/O6 and I/O2, I/O7 and I/O3 are respectively paired similarly to I/O4 and I/O0 described above.

According to the technique for storing multivalued information to be achieved with the flash memory 1 shown in FIG. 2, one memory cell is in an information storage state which is selected from among an erase state ("11"), a first write state ("10"), a second write state ("00") and a third write state ("01") . The four kinds of information storage states are states which are determined by data of two bits. Specifically two bits of data are stored in one memory cell. The relationship between the data of four values and threshold voltages is as represented by the distribution of the threshold voltages in FIG. 8.

To achieve the threshold distribution shown in FIG. 8, write verify voltages to be applied to the word fines during a write operation after erasure are set at three different voltages, and the write operation is performed in three separate steps by sequentially switching the three kinds of voltages. In FIG. 8, VWV1, VWV2 and VWV3 represent write verify voltages to be used to establish the first, second and third write states, respectively.

Figure 9:
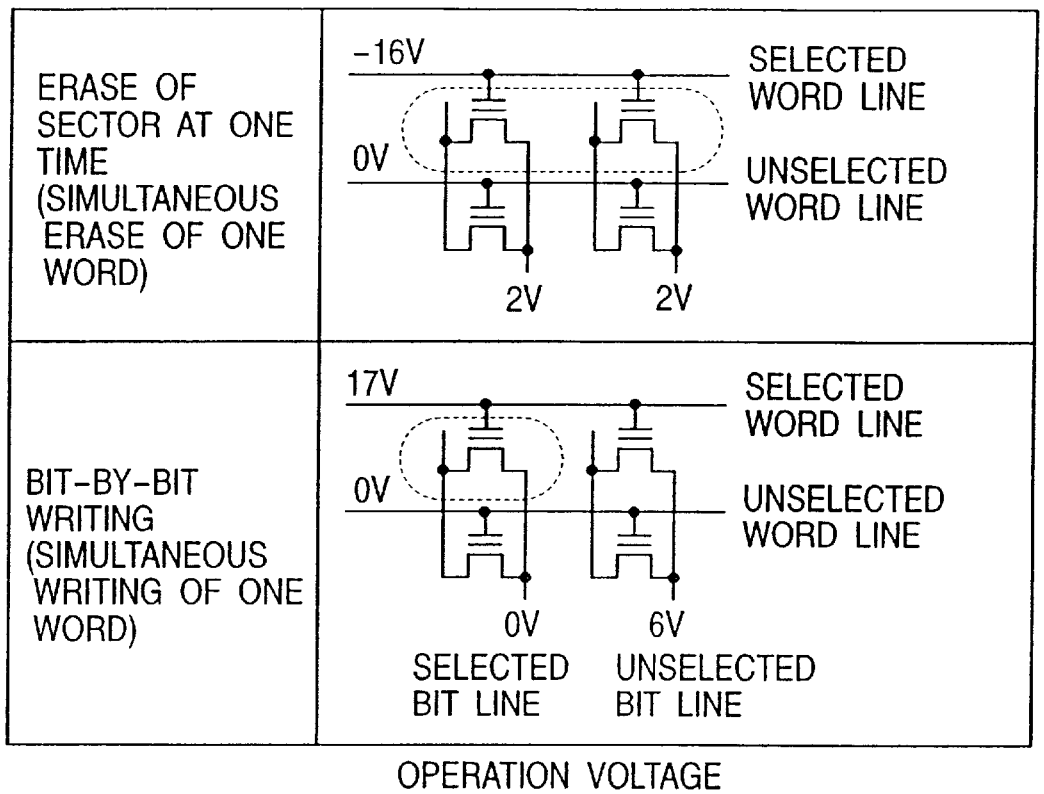
FIG. 9 is a table which illustrates an example of voltage conditions for one-time sector erase and writing.

FIG. 9 shows examples of the states of voltages applied to word lines and bit lines during each of the three separate write operations. Voltages of 0 V and 6 V are applied to a bit line selected for writing and to an unselected bit line, respectively. For example, the word lines are at 17 V, although this is not a limitation of the invention. The threshold voltage of the memory cells is increased as the application time of the high voltage for writing is increased. The three kinds of write threshold voltages can be controlled by controlling the time of such a high voltage state and controlling the level of the high voltage applied to the word lines.

A voltage of 0 V or 6 V is applied to a bit line depending on the logical value of write control information latched in the sense latch circuit SL. The write operation selection memory mat effects control such that writing is not selected when the data latched in the sense latch circuit has a logical value "1" and such that writing is selected when it has a logical value "0". The details of such control will be described later. As shown in FIG. 9, when a sector is erased at one time, a selected word line is set at −16 V; an unselected.,word line is set at 0 V; and a selected bit line is set at 2 V.

The operation of latching write control information in the sense latch circuit SL is controlled at each of the three separate write operations. Such write control is carried out by the mode control circuit 18, and write control information to be latched in the sense latch circuit SL at this time is generated by performing calculations using write data bits stored in the data latch circuits DLL and DLR at each write operation and is latched in the sense latch circuit SL. For example, let us assume that as shown in FIG. 7, the write data latched in the data latch circuits DLL and DLR is "01", which is the third write state as shown in FIG. 8. When a write procedure is employed, in which a write operation in three separate steps after an erase state generates write states in the order of increasing threshold voltages, as indicated by the second mode (case 2) in FIG. 10, the result of a calculation using write data ("01") in the data latch circuits DLL and DLR during the first write operation (1) to achieve the first write state (write control information) has a logical value "1"; the result of a calculation usinq write data ("01") in the data latch circuits DLL and DLR during the second write operation (2) to achieve the second write state has a logical value "1"; and the result of a calculation using write data ("01") in the data latch circuits DLL and DLR during the third write ope ration (3) to achieve the third write state (write control information) has a logical value "0". Such calculations are carried out by operating the switch circuit/ arithmetic circuit array (31L, 30L or 31R, 30R). Therefore, the write voltage is applied only at the third writing (3), and the third write state ("01") is established in the relevant memory cells from among the four values.

Even when such three separate write operations are performed, the write data initially latched in the data latch circuits DLL and DLR are maintained as they are without being corrupted. This is because a control sequence is employed in which the 2 bits of write data latched in the data latch circuits DLL and DLR are calculated by the switch circuit/arithmetic circuit array (31L, 30L and 31R and 30R) at each write operation and in which the data representing the calculation result is set in the sense latch circuit SL each time.

Figure 10:
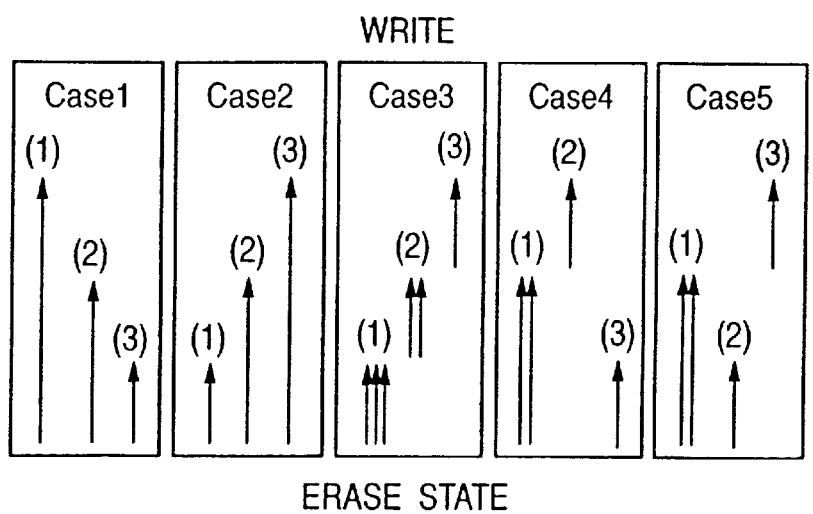
FIG. 10 is a diagram which illustrates various modes of writing in a four-value writing process.

The order in which the threshold voltages are switched during a write operation is not limited to the second mode (case 2) in FIG. 10. The order may be set such that it starts with the highest threshold voltage as in the first mode (case 1) or the same rate of change may be used to establish the threshold voltage of any write state in one write operation as in the third mode (case 3). Alternatively, control may be carried out as shown in the fourth mode (case 4) or the fifth mode (case 5). Specifically, in the case 4, the thresholds of memory cells to be loaded with data "00" or "01" are changed to a threshold associated with "00" at the first writing (1). Next, the thresholds of the memory cells to be loaded with data "01" among the memory cells set to the threshold associated with data "00", at the first writing (1) are changed to a threshold associated with data "01" at the second writing (2). Then, the thresholds of the memory cells to be loaded with data "10" are changed to a threshold associated with data "10", at the third writing (3). In the case 5, the thresholds of memory cells to be loaded with data "00" or "01" are changed to the threshold associated with "00" at the first writing (1) just as in the case 4. Next, the thresholds of the memory cells to be loaded with data "01" are changed to the threshold associated with data "10" at the second writing (2). Then, the thresholds of the memory cells to be loaded with data "01" among the memory cells set at the threshold associated with data "00" at the first writing (1) are changed to the threshold associated with data "01" at the third writing (3).

During a data read operation, three kinds of voltages are set as word line selection levels to be appl ied to the word lines; three read operations are performed with the three word line selection levels changed sequentially; and binary (1 bit) data read from a memory cell at each read operation are latched in the sense latch circuit 4. At each latching, a calculation is carried out to reflect the sense-latched contents to the data latch circuits as two bits of information. The two bits obtained in the data latch circuits DLL and DLR as a result of the three sense latching operations are data associated with the four-valued information stored in the memory cell.

Figure 11:
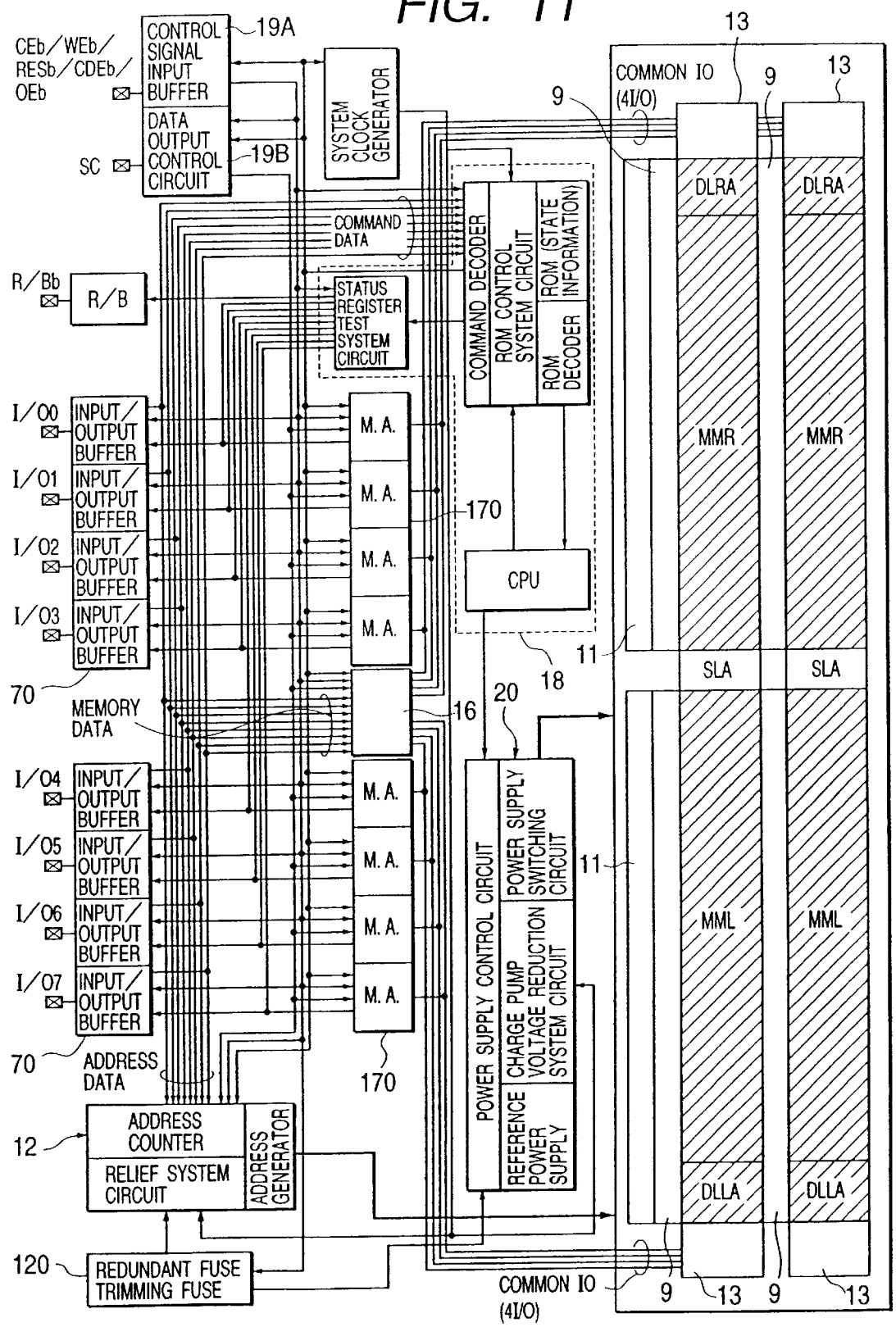
FIG. 11 is a block diagram showing a configuration of the four-valued flash memory in FIG. 1 from the viewpoint of layout.

FIG. 11 shows a block diagram which represents the layout of the flash memory shown in FIG. 2. Referring to FIG. 11, the mode control circuit 18 comprises a command decoder, a ROM for storing state information, a ROM decoder, a ROM control system circuit, a CPU and a status register/test system circuit. The Y address counter 12 includes a relief control system circuit that utilizes redundancy. The multiplexer 7 and input buffer 17 in FIG. 2 are implemented in the form of an input buffer 70, data signal wiring and main amplifier 170 in FIG. 11. The control signal buffer circuit 19 in FIG. 2 is constituted by a control signal input buffer circuit 19A and a data input/output control circuit 19B. In the memory cell array 3, two pairs of memory mats MMR and MML are provided on both sides of the sense latch circuit array SLA.

(Details of Memory Array)

Figure 1:
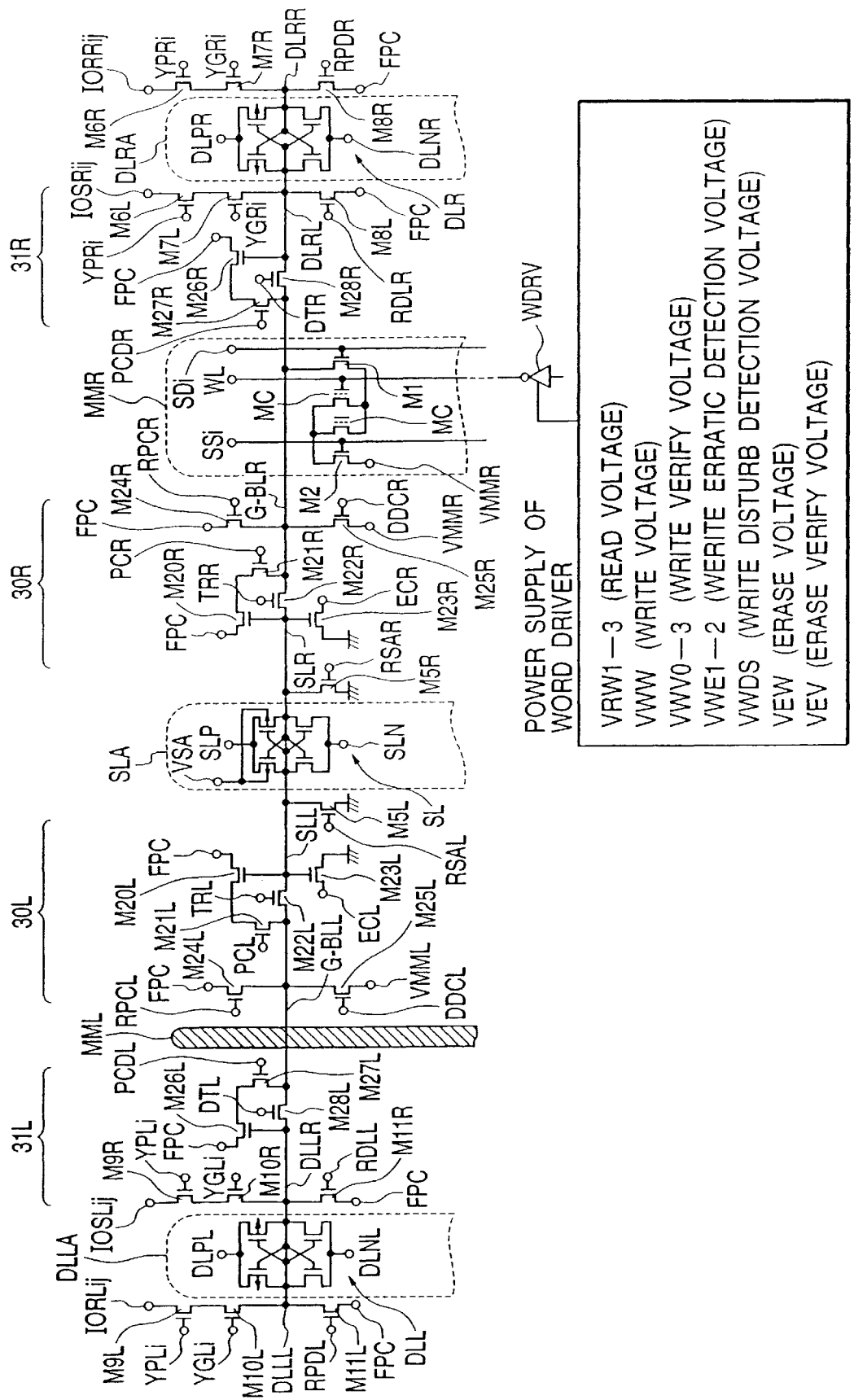
FIG. 1 is a circuit diagram illustrating a circuit configuration around bit lines of a four-valued flash memory according to an embodiment of the invention.

The memory array will now be described in detail. FIG. 1 shows an example of a circuit configuration which is focused on the sense latch circuits and data latch circuits of the flash memory. FIG. 1 shows a representative configuration around a pair of bit lines G-BLL and G-BLR on the left and right of one sense latch circuit SL. As apparent from FIG. 1, the configuration around the pair of left and right bit lines G-BLL and G-BLR has a mirror symmetric structure relative to the sense latch circuit SL.

The memory mats MML and MMR includes a plurality of memory cells MC which can be electrically rewritten (several cells are shown to represent them). As shown in FIG. 3, one memory cell MC is constituted by one transistor (memory cell transistor) which has a control gate, a floating gate, a source and a drain and which can be electrically rewritten. The memory cells have the so-called AND type layout, although this is not a limitation of the invention. As illustrated at the side of the memory mat MMR, in the AND type configuration, a plurality of memory cell transistors are arranged in parallel with diffusion layers (semiconductor regions) forming a source and a drain shared by them. The diffusion layer forming the drain is connected to the bit line G-BLR through a selection transistor M1, and the diffusion layer forming the source is connected to a common source line VMMR through a selection transistor M2. SSi represents a switching control signal for the selection transistor M2, and SDi represents a switching control signal for the selection transistor M1. WL represents a word line coupled to the control gate of the memory cell MC. The memory mat MML has the same configuration. In the drawings accompanying the present specification, a p-channel type MOS transistor is marked with an arrow at the substrate gate thereof to be distinguished from an n-channel type MOS transistor.

The sense latch circuit SL is constituted by a static latch comprising a pair of CMOS inverters, which latch is specifically a circuit formed by connecting the input terminals of the CMOS inverters to each other's output terminals. SLR and SLL represent a pair of input/output nodes of the sense latch circuit SL. SLP and SLN represent operating power supplies of the sense latch circuit SL. MOS transistors M5L and M5R selectively discharge (clear) the input/output nodes SLL and SLR.

The data latch circuit DLR is constituted by a static latch, comprising a pair of CMOS inverters, which latch is specifically a circuit formed by connecting the input terminals of the CMOS inverters to each other's output terminals. DLRR and DLRL represent a pair of input/output nodes of the data latch circuit DLR. DLPR and DLNR represent operating power supplies of the data latch circuit DLR. A series circuit formed by MOS transistors M6L and M7L and a series circuit formed by MOS transistors M6R and M7R constitute a column.switch circuit for input and output of data in the form of complementary signals to and from the data latch cir'cuit DLR. MOS transistors M8L and M8R are transistors for selectively charging the input/output nodes DLRL and DLRR.

The data latch circuit DLL is constituted by a static latch, comprising a pair of CMOS inverters, which latch is specifically a circuit formed by connecting the input terminals of the CMOS inverters to each other's output terminals. DLLR and DLLL represent a pair of input/output nodes of the data latch circuit DLL. DLPL and DLNL represent operating power supplies of the data latch circuit DLL. A series circuit formed by MOS transistors M9L and M10L and a series circuit formed by MOS transistors M9R and M10R constitute a column switch circuit for input and output of data in the form of complementary signals to and from the data latch circuit DLL. MOS transistors M11L and M11R are transistors for selectively charging the input/output nodes DLLL and DLLR.

The switch circuit/arithmetic circuit array 30R includes a circuit formed by MOS transistors M20R through M25R for each bit line G-BLR. The transistor M20R receives a voltage level at the input/output node SLR of the sense latch circuit SL at its gate and, if it is a high level, the transistor supplies a voltage FPC to the bit line G-BLR through the MOS transistor M21R. In this case, the level of the voltage supplied to the bit line G-BLR is determined by control over the conductance of the MOS transistor M21R effected by the voltage level of a control signal PCR. The transistor M22R constitutes a transfer gate that selectively establishes conduction between the input/output node SLR and the bit line G-BLR. The MOS transistor M23R is used for ALL determination. MOS transistors M24R and M25R are used to precharge and discharge the bit line G-BLR. The switch circuit/arithmetic circuit array 30L similarly includes a circuit formed by MOS transistors M20L through M25L for each bit line G-BLL. Gate control signals for the MOS transistors M20L, M21L, M24L and M25L are different from those for the MOS transistors M20R, M21R, M24R and M25R. The MOS transistors M22L and M22R are controlled such that they always operate simultaneously.

The switch circuit/arithmetic circuit array 31R includes a circuit formed by MOS transistors M26R through M28R for each bit line G-BLR. The transistor M26R receives a voltage level at the input/output node DLRL of the data latch circuit DLR at its gate and, if it is a high level, the transistor supplies a voltage FPC to the bit line G-BLR through the MOS transistor M27R. In this case the level of the voltage supplied to the bit line G-BLR is determined by control over the conductance of the MOS transistor M27R effected by the voltage level of a control signal PCDR. The transistor M28R constitutes a transfer gate that selectively establishes conduction between the input/output node DLRL and the bit line G-BLR. The switch circuit/arithmetic circuit array 31L similarly includes a circuit formed by MOS transistors M26L through M28L for each bit line G-BLL as described above. Gate control signals for the MOS transistors M27L and M28L are different from those for the MOS transistors M27R and M28R.

FIG. 1 shows one word driver WDRV, which is representative. The operating power supply of the word driver WDRV, i.e., the driving voltage for the word line, is determined in accordance with the operation of the flash memory 1 and is selected from among read voltages VRW1 through VRW3, a write voltage VWW, write verify voltages VWV0 through VWV3, erratic write detection voltages VWE1 and VWE2, a write disturb detection voltage VWDS, an erase voltage VEW and an erase verify voltage VEV.

In the configuration of FIG. 1, the circuit basically operates as follows during reading and writing. For example, to read the memory cells MC included in the memory mat MMR in FIG. 1, a signal RPCL at the selected memory mat MMR is set at 1 V+Vth and a signal at the unselected memory mat MML is set at 0.5 V+Vth to precharge the bit lines at the side of the selected mat at 1V at one time and to precharge the bit lines at the side of the unselected mat at 0.5 V. Obviously, if the memory mat MML is selected and the memory mat MMR is unselected, the signals RPCR and RPCL are set at 0.5 V+Vth and 1 V+Vth, respectively. Vth represents the threshold voltage of the MOS transistors M24R and M24L. The voltage of 0.5 V serving as the precharge level of the bit lines at the side of an unselected memory mat is used as a reference level of the sense latch circuit SL as described above. After a word line selecting operation, the transfer MOS transistors M22L and M22R are turned on and, at this time, the sense latch circuit SL senses whether the level of the bit line GBLR is higher or lower than 0.5 V and latches data read from the memory cells MC. Which of the four values of the stored information is latched in the sense latch circuit is determined by the relationship of the same with the read word line selection level at that time. This determination process is performed using the switch circuit/arithmetic circuit arrays 30R, 30L, 31R and 31L, although the details will be described later. Two bits of data corresponding to the result of the determination are latched in the two left and right data latch circuits DLL and DLR of the sense latch circuit SL.

When the power supply SLP of the sense latch circuit SL is set at a write disabling voltage of, for example, 6V and one of the input/output nodes of the sense latch circuit SL is set at "1" after write control information is latched in the sense latch circuit SL during writing, the write disabling voltage of 6 V is applied to the bit line associated with the input/output node. If the input/output node of the sense latch circuit is set at "0", the bit line associated with the input/output node is maintained at 0 V. In memory cells having a drain voltage of 0 V relative to the high voltage at the control gate, a high electric field required for writing is formed to perform writing. Thus, the logical value of the write control information latched in the sense latch circuit SL determines whether a write voltage is actually applied or not. The logical value is determined by data latched in the left and right data latch circuits DLL and DLR and to which of the first through third write states the current write operation corresponds. The logic for such determination will be described later.

A verify operation that immediately follows the application of the write voltage for any of the first through third writing is performed in the form of an ALL determination operation on the sector to be written. For example, after the write voltage is applied, the signal PCR at the selected memory mat MMR is controlled to, for example, 1 V+Vth to precharge the bit line G-BLR at 1 V, and the gate voltage RPCL of the MOS transistor M24L at the unselected memory mat MML is controlled to 0.5 V+Vth to precharge the bit line G-BLL at 0.5 V. Vth means the threshold voltage of the MOS transistors M21R and M21L. The verify voltage VWV1, VWV2 or VWV3 is applied to the word line in this state just as in a read operation. If there is any memory cell(s) having a threshold equal to or lower than the verify voltage applied to the word line, i.e., if there is any memory cell(s) which has not reached the required threshold voltage, the bit line is discharged. After it is determined if there has been bit line discharge caused by a verify voltage, a bit line which is not selected for writing at the selected for memory mat is precharged at 1 V. Specifically, the input/output node of the sense latch circuit SL of the bit unselected for writing at the selected memory mat is set at a logical value "1". The transistor M20R can be turned on by the data having a logical value "1" latched in the sense latch circuit SL to control the signal PCR, for example to 1 V+Vth, thereby precharging the bit line unselected for writing at 1 V (masking with an unselected precharge process). Thus, if all of memory cells selected for writing are at required threshold voltages, all of the bit lines at the selected memory mat are in a precharge state, the transistors M23L and M23R for ALL determination determine the state. The gates of the MOS transistors M23L and M23R are connected to the bit lines associated therewith, and the sources thereof are coupled to a ground potential. There is actually provided a multiplicity of the configuration of bit lines G-BLL and G-BLR around a sense latch circuit SL as typically shown in FIG. 1. The drain of the transistor M23L to the left of the sense latch circuit SL in FIG. 1 is commonly connected to a terminal ECL to which a current depending on the state (level) of left-hand side bit lines represented by the bit lines G-BLL flows to the terminal ECL. The drain of the transistor M23R to the right of the sense latch circuit SL in FIG. 1 is commonly connected to a terminal ECR to which a current depending on the state (level) of right-hand side bit lines represented by the bit lines G-BLR flows to the terminal ECR.

Although not shown, there is provided a current sensing amplifier which detects whether all of the bit lines G-5LL (G-BLR) to the left (right) of the sense latch circuit SL have become the same state based on the change at the terminal ECL (ECR). This amplifier is used to detect whether all of memory cells under erase verify or write verify have reached predetermined threshold voltages, i.e., for all determination.

Figure 41:
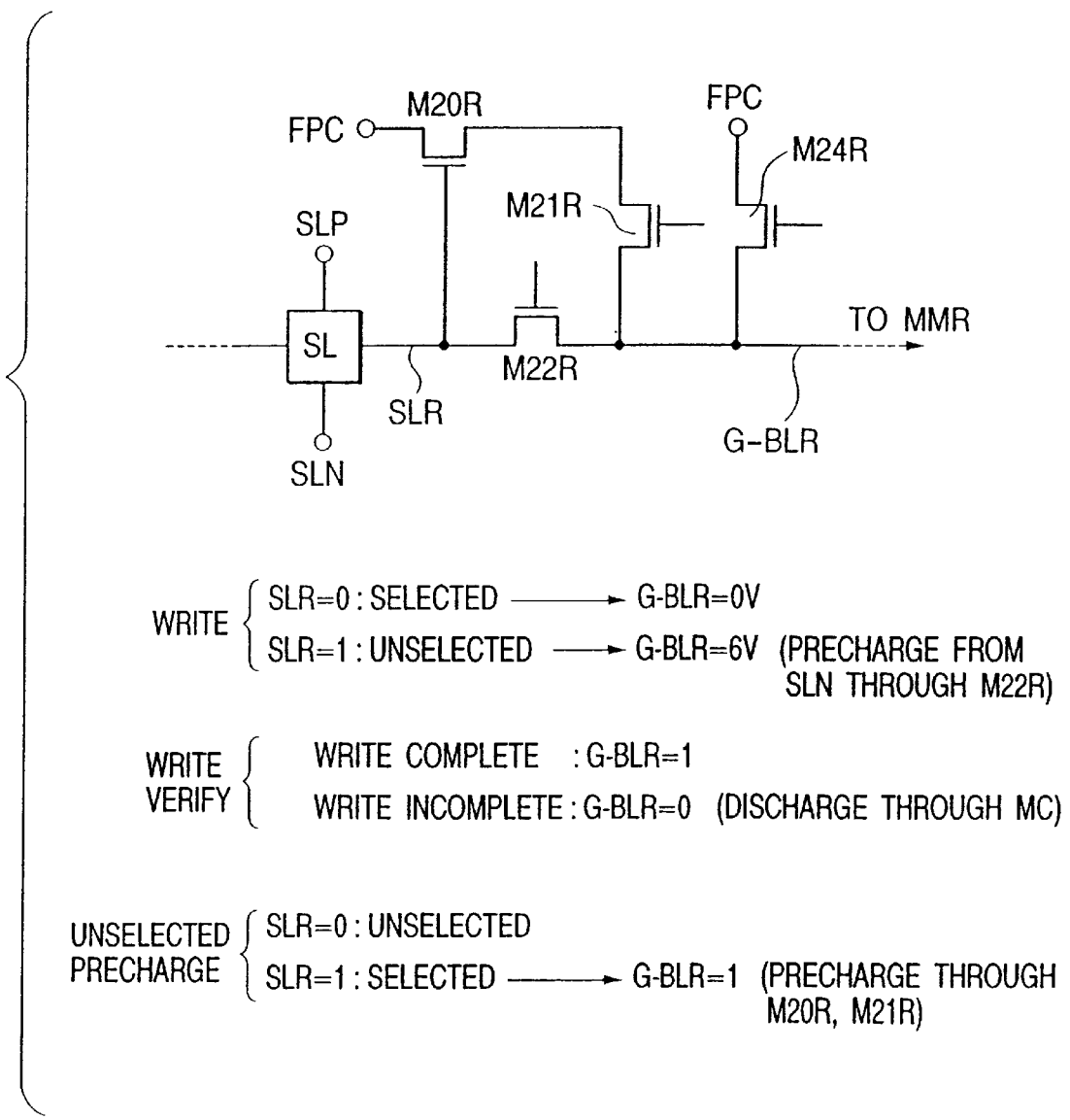
FIG. 41 is a diagram which summarizes the relationship between data latched in the sense latch circuit during writing and write verification and operations based on the same.

A summary is given here of the relationship between data latched in a sense latch circuit SL (the value of the data input/output node at the side of a selected mat) and an operation based on the same during writing and write verification. As shown in FIG. 41, let us assume that the memory mat MMR is selected. Then, a write operation is selected when the node SLR of the sense latch SL is 0 and unselected when node SLR is 1. A write disabling voltage of 6 V is supplied to the bit line G-BLR which is unselected for writing. While the threshold voltage of a memory cell selected for writing is lower than a verify voltage, the bit line of the memory cell is discharged during a write verify operation (G-BLR=0). When writing has been completed, the bit line is maintained at a precharge level (G-BLR=0). During an ALL determination operation at the write verification, the bit line of the memory cell unselected for writing is forcibly precharged. Specifically, the bit line G-BLR unselected for writing is precharged through the transistors M20R and M21R (massing through unselected precharge) when the input/output node SLR of the sense latch circuit is 1. When the threshold voltage of all memory cells to be written are equal to or higher than the verify voltage, all of the bit lines in the sector to be written are maintained at the precharge state. The ALL determination is made based on the logical OR of the logical values of all bit lines in the sector to be written.

A detailed description will now be made of each of read, write, additional write and erase operations on the flash memory 1 having the above configuration. (Read Operation)

Figure 13:
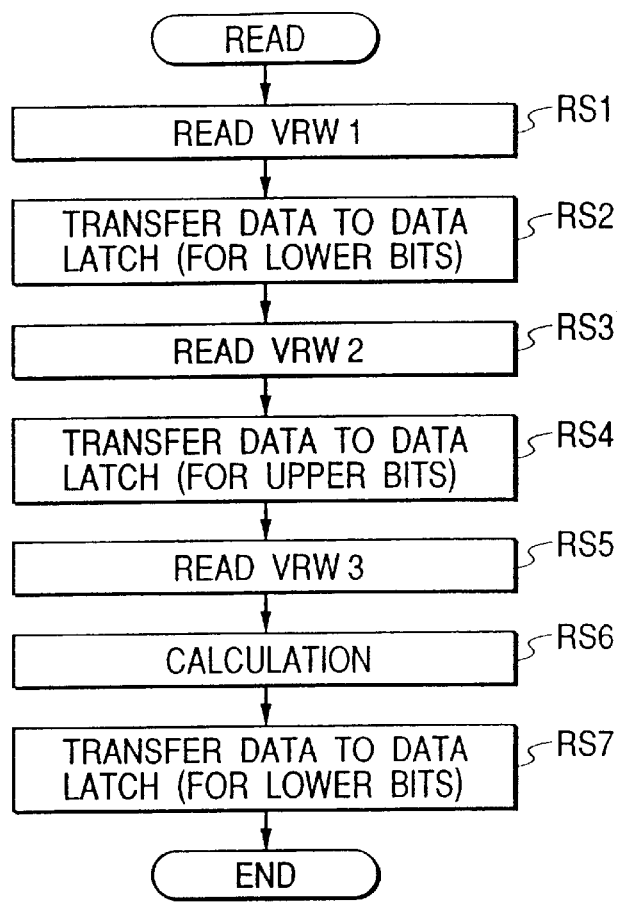
FIG. 13 is a flow chart showing an example of a read operation on the four-valued flash memory.
Figure 14:
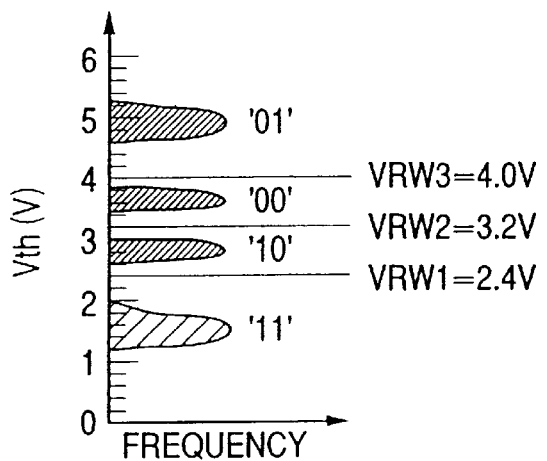
FIG. 14 is a diagram which illustrates the relationship between a threshold voltage distribution of a flash memory cell transistor and a voltage on a read word line.

FIG. 13 shows a flow chart for the read operation. FIG. 14 illustrates the relationship between the threshold voltage of each non-volatile memory cell and read word line voltages VRW1 through VRW3. Upon receipt of a read command, the flash memory 1 performs a read operation on the sector address specified by the command using the read word line voltage VRW1 (RS1). The read data are latched in the sense latch, circuit SL, and the latched data are supplied to the data latch circuit DLR (RS2). Next, a read operation is performed using the read word line voltage VRW2 on the same sector address, and the read data are latched in the sense latch circuit SL (RS3). The latched data are supplied to the data latch circuit DLL this time (RS4). A read operation is further performed on the same sector address using the read word line voltage VRW3 (RS5), and the read data and the data already latched in the data latch circuit DLR are used to carry out a calculation to determine which of the first, second and third write states the threshold voltage of the memory cell is in (RS6), and the result of the calculation is reflected in the data latch circuit DLR (RS67). As a result, four-valued information stored in the memory cell is held in the two data latch circuits DLR and DLL.

FIG. 26 shows a detailed example of a procedure for the write operation in association with the state of the sense latch circuit, bit line and data latch circuit. FIG. 26 shows the contents of the right-hand side memory mat MMR in FIG. 1 which is selected for writing. Referring to the figures shown in association with signals and nodes for each step, a figure with a decimal point represents a voltage and a figure without a decimal point represents a logical value (high and low levels are represented by "1" and "0", respectively). The columns for the data latch circuits DLL and DLR may show the values of both node s, and a figure without brackets is a logical value of interest. In FIG. 26, SL(R) and SL(L) respectively represent the input/output nodes SLR and SLL of the sense latch circuit SL.

When VRW1 is read at step 1 in FIG. 26, memory cell in the erase state ("11") can be distinguished from memory cells in other states, and the read data of 1 bit is transferred to the data latch circuit DLR (stop 2). When VRW2 is read at step 3, memory cells in the erase state ("11") and the first write state ("10") can be distinguished from memory cells in other states, and the read data of 1 bit is transferred to the data latch circuit DLL (step 4). It is apparent from FIG. 14 that the data latched in the data latch circpit DLL is the higher order bit of the 2 bits of read data. The logical value of the lower order bit can not be fixed until VRW3 is read. Then, VRW3 is read at step 5 to distinguish memory cells in the third write state ("01") from memory cells in other states, and the bit line is cleared to "0" using the transistors M25R and M25L with the 1 bit of read data kept latched in the sense latch circuit SL (step 6). In order to perform a calculation to determine the logical value of the lower bit of the 2 bits of read data, the data in the data latch circuit DLR are transferred to the bit line (step 7), and the switching of the transistor M20R is controlled using the data latched in the sense latch circuit SL to discharge the bit line of the sense latch circuit SL in which the logical value "1" is latched to the logical value "0" (step 8). This exclusive OR process is carried out on the upper bit and the result of reading VRW3. As a result, the low bit of the 2 bits of read data is determined on the bit line, and the data on the bit line G-BLR are transferred to the data latch circuit DLR through the transistor M28R after the input node of the data latch circuit DLR is cleared by the transistors M8R and M8L (step 10). The 2 bits of read data latched in the data latch circuits DLR and DLL are output externally through a predetermined terminal among the external terminals I/O0 through I/O7.

(Write Operation)

Figure 15:
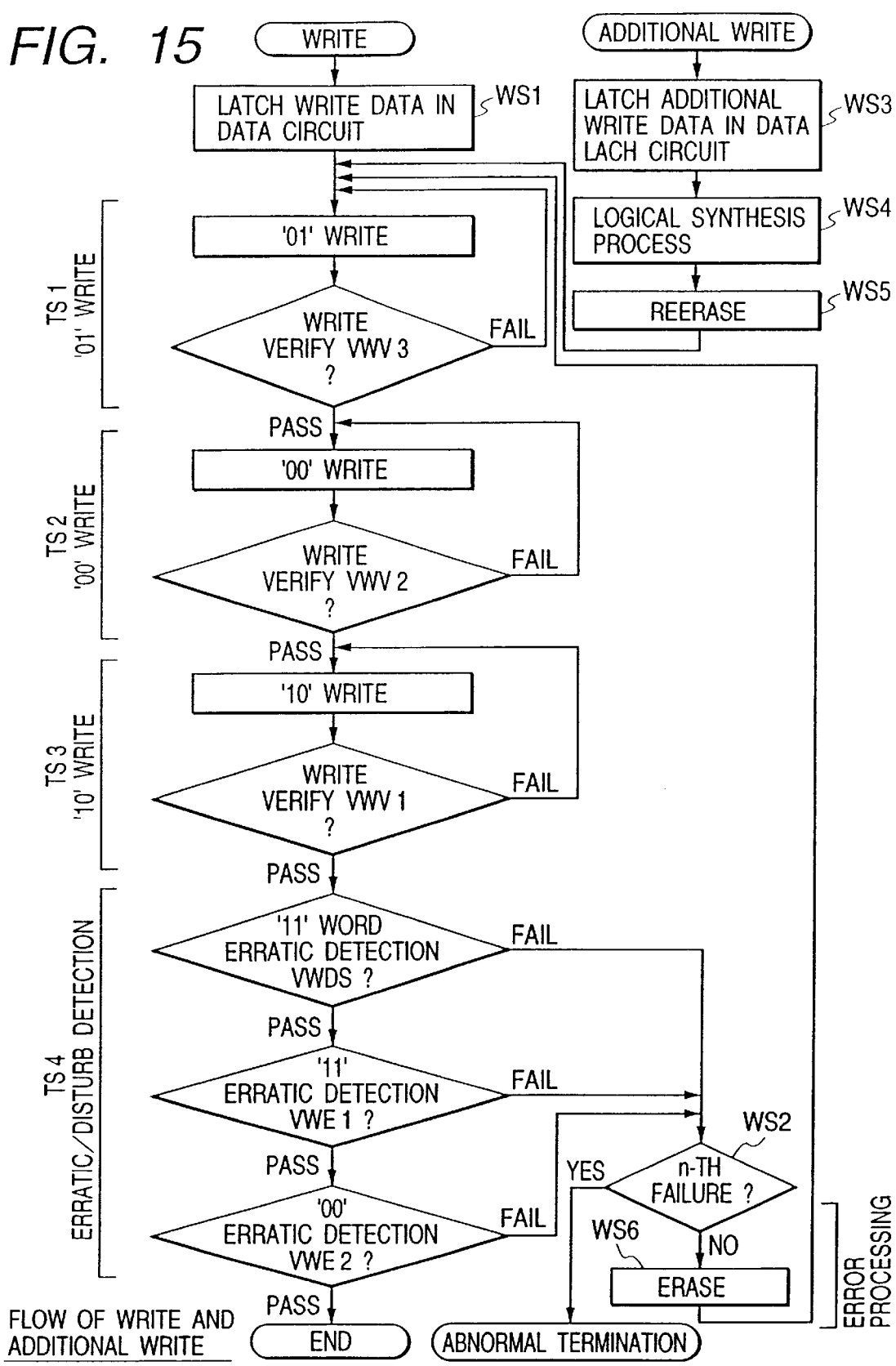
FIG. 15 is a flow chart showing examples of a write operation and an additional write operation on the four-valued flash memory.

FIG. 15 shows a flow chart of a write operation. The write operation involves writing on a word line by word line basis (sector writing). Upon receipt of a command, the flash memory fetches the next input as a sector address and fetches data subsequent to the acceptance of the sector address as write data (WS1). The fetched sector address is an X-address and, as a result, one word line is selected to which a high write voltage is applied. The write data are fetched into the data latch circuits DLL and DLR byte-by-byte with the Y-address counter 12 gradually incremented from the initial value. For example, as shown in FIG. 6, the write data are latched in data latch circuit arrays DLLA and DLRA assigned to a pair of memory mats MML and MMR associated with one sense latch circuit array SLA. For example, when the control gates of n memory cells are coupled to one word line, n bits of write data are latched in each of the data latch circuit arrays DLLA and DLRA.

Figure 18A:
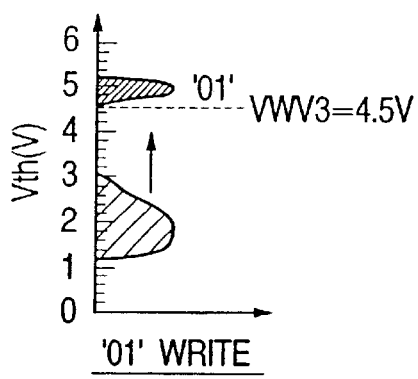
FIGS. 18A through 18F are diagrams which illustrate each of a "00", write state, a "10" write state, a "01" write state, an erratic/disturb detection state, a state before additional writing and an erase back state in the form of a threshold voltage distribution of a flash memory cell transistor.
Figure 18B:
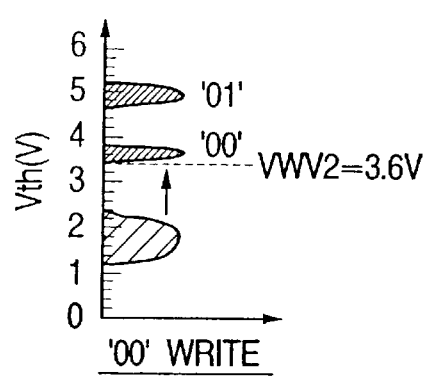
Figure 18C:
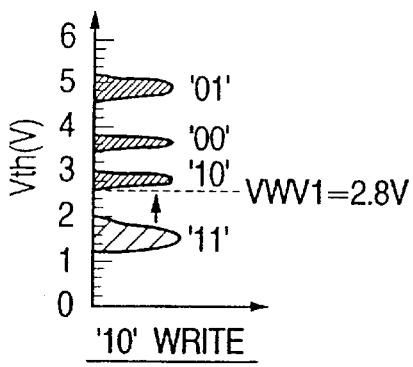
Figure 18D:
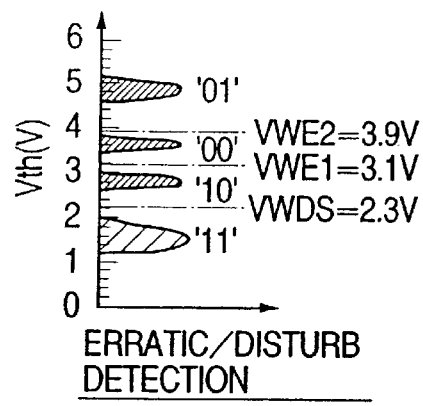

The latching of the write data is followed by a "01" writing process TS1, a "00" writing process TS2, a "10" writing process TS3 and an erratic/disturb detection process TS4. FIGS. 18A through 18C show an example of the relationship between threshold voltage distributions obtained by the "01" writing process TS1, "00" writing process TS2 and "10" writing process TS3 and verify voltages therefor. FIG. 18D shows an example of the relationship between a threshold voltage distribution and a verify voltage at the erratic/disturb detection process TS4.

The "01" writing process is a process of bringing the threshold voltage of a memory cell MC into the third write state ("01") from the erase state ("11") which is one of the states in four values, and the write verify voltage VWV3 is used.

Figure 16:
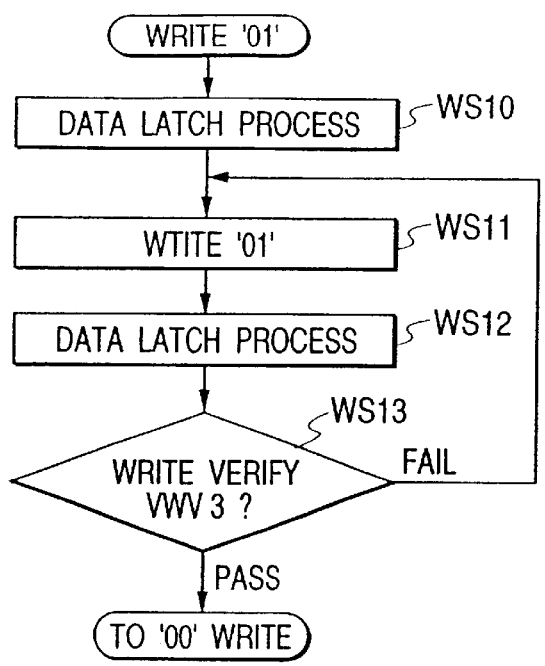
FIG. 16 is a flow chart showing a detailed example of a "01" writing process included in the write operation.

As shown in detail in FIG. 16, the "01" writing process includes a data latch process WS10, a "01" writing process WS1, a data latch process WS12 and a write verify process WS13. The data latch process WS10 is a process of latching control data having a logical value to enable the application of a write voltage in response to 2-bit data "01" latched in the data latch circuits DLL and DLR. The "01" writing process WS11 applies a write voltage associated with the "01" data in the memory cells on the bit line associated with a sense latch circuit SL in which control data having the logical value of an enable level are latched. As previously described, when the input/output node of a sense latch circuit SL at the side of a memory mat selected for writing is set at a logical value "0", a write voltage is applied to the memory cells on the bit line connected to the node. The data latch process WS12 is a process for performing the determination at a verify process WS13 based on the 2 bits of write data in the data latch circuits DLL and DLR each time "01" writing is carried out. The verify process WS13 is performed through ALL determination as described above.

The "00" writing process TS2 is a process for bringing the threshold voltage of a memory cell MC into the second write state ("00") from the erase state ("11") which is one of the states in the four values, and the write verify voltage VWV2 is used. The "00" write process TS2 is substantially the same as that shown in FIG. 16, except that the data latching process latches control data having a logical value to enable writing in response to 2-bit data of "00" latched in the data latch circuits DLL and DLR in the sense latch circuit SL and except that the write verify voltage VWV2 is used.

The "10" writing process TS3 is a process for bringing the threshold voltage of a memory cell MC into the first write state ("10") from the erase state ("11"), which is one of the states in the four values, and the write verify voltage VWV1 is used. The "10" write process TS3 is substantially the same as that shown in FIG. 16, except that the data latching process latches control data having a logical value to enable writing in response to 2-bit data of "10" latched in the data latch circuits DLL and DLR in the sense latch circuit SL and except that the write verify voltage VWV1 is used. As apparent from the example shown in FIGS. 18A through 18C, the write verify voltages satisfy VWV3>VWV2>VWV1.

As shown in FIG. 18D, the erratic/disturb detection process TS4 is comprised a "11" word disturb detection process for detecting whether the threshold voltage of a memory cell in the erased state is above a write disturb detection voltage VWDS, a "10" erratic detetion process for detecting whether the threshold voltage of a memory cell transistor in which "10" is written is above VWE1 and a "00" erratic detection VWE2 process for detecting whether the threshold voltage of a memory cell transistor in which "00" is written is above an VWE2. "Word disturb" is an unwanted increase of the threshold voltage of a memory cell unselected for writing due to exposure to a certain level of high voltage as a result of the application of a high voltage on a word line by word line basis and is detected by a "11" word disturb detection process. The term "Erratic" refers to an unwanted increase of a threshold voltage with a probability based on electronic solid state properties which is detected by the erratic detection process.

When the series of processes up to the erratic/disturb detection process TS4 has a normal result, a pass flag is set in a status register 180, and the series of processes terminates. When the result of detection at the erratic/disturb detection process TS4 is "fail", it is determined whether the number of failures has reached a predefined number of times (WS2) and, if not, the written sector is erased (WS6) and the process is repeated from the "01" writing. The number of retries is maintained in counter means which is not shown, and it is determined from the count in the counter means whether the number of failures has reached a predefined value. When the number of errors reaches the defined value, a fail flag is set in the status register 180, and the series of write processes results in abnormal termination.

As apparent from FIG. 15, when writing is repeated after bulk erasure, it is not necessary to fetch data to be written in the sector from the outside again. This is because the write data in one sector temporarily latched in the data latch circuits DLL and DLR at step WS1 are not corrupted by the processes TS1 through TS4 and are maintained as they are in the data latch circuits DLL and DLR.

This is based on the above-described mode of controlling the operation of latching write control information in the sense latch circuit SL.

Specifically, write control information to be latched in the sense latch circuit SL is generated by performing a calculation using write data bits held in the data latch circuits DLL and DLR at each write operation and is latched in the sense latch circuit SL. For example, as shown in FIG. 7, when the write data latched in the data latch circuits DLL and DLR is "01", the "01" state is the third write state as shown in FIG. 8. Three separate write operations after erasure are performed in the second mode (case 2) in FIG. 10. The calculation using the write data ("01") in the data latch circuits DLL and DLR at the first write operation to obtain the first write state results.in the logical value "1"; the calculation using the write data ("01") in the data latch circuits DLL and DLR at the second write operation to obtain the second write state results in the logical value "1"; and the calculation using the write data ("01") in the data latch circuits DLL and DLR at the third write operation to obtain the first write state results in the logical value "0". Such calculations are carried out by operating the switch circuit/arithmetic circuit arrays 30L, 30R, 31L and 31R. In this case, therefore, a high electric field for writing is applied between the drain and control gate of the memory cell transistor only at the third writing to establish the third write state among the four values in the memory cell.

When the three separate write operations are thus carried out, the write data initially latched in the data latch circuits DLL and DLR are not corrupted and are maintained as they are. This is because a control sequence is used in which the 2 bits of write data latched in the data latch circuits DLL and DLR are used for the calculation at each write operation and the result is set in the sense latch circuit SL each time. During the erratic/disturb detection process, a similar control sequence is used in which the result of each calculation using the 2 bits of data latched in the data latch circuits DLL and DLR is set in the sense latch circuit SL each time. Therefore, using a control sequence, the write data initially latched bit lines with the transistors M26R and M27R after discharging the bit lines with the transistor M25R. More specifically, the bit lines G-BLL at the unselected memory mat are precharged at 0.5 V through the transistor M24L (a), and the bit lines G-BLR are precharged at 0.0 V or 1.0 V using the transistors M26R and M27R in accordance with the data latched in the data latch circuit DLR (b).

At step 3, the sense latch circuit SL is activated for a sense latch operation according to the results of the operations (a) and (b). As a result, the left and right input/output nodes SL(L) and SL(R) of the sense latch circuit SL are brought into the states shown at (c) and (d) in FIG. 27.

At step 4, the bit lines G-BLL have a voltage as shown at (e) according to the result (c), and the other bit lines G-BLR are cleared to "0".

At step 5, the transistor M26L is turned on according to the data having the logical value "1" latched in the data latch circuit DLL, and the bit lines G-BLL associated with the data latch circuit DLL latching the logical value "1" are discharged to 0 V through the transistors M27L and M26L (g). The voltage FPC is at the ground level at this time. The input/output terminals SL(L) and SL(R) of the sense latch circuit SL are both cleared to the logical value "0" through the transistors M5L and M5R between the data bits A and B; a "10" write data latch process performs a logical OR operation between inverted data of the data bit A and the data bit B; a "00" erratic detection data latch process performs a negative logical OR operation between the data bits A and B; a "10" erratic detection data latch process performs a logical AND operation between the data bit A and inverted data of B; a "11" erratic detection data latch process performs a logical AND operation between the data bits A and B.

When the arithmetic logic in FIG. 21 is used, the logical values obtained by the calculations on the logical values of the data bits A and B are as shown in FIG. 22. As previously described, the logical value "0" (low value) in the sense latch data means the application of a write electric field (selection for writing).

Figure 27:
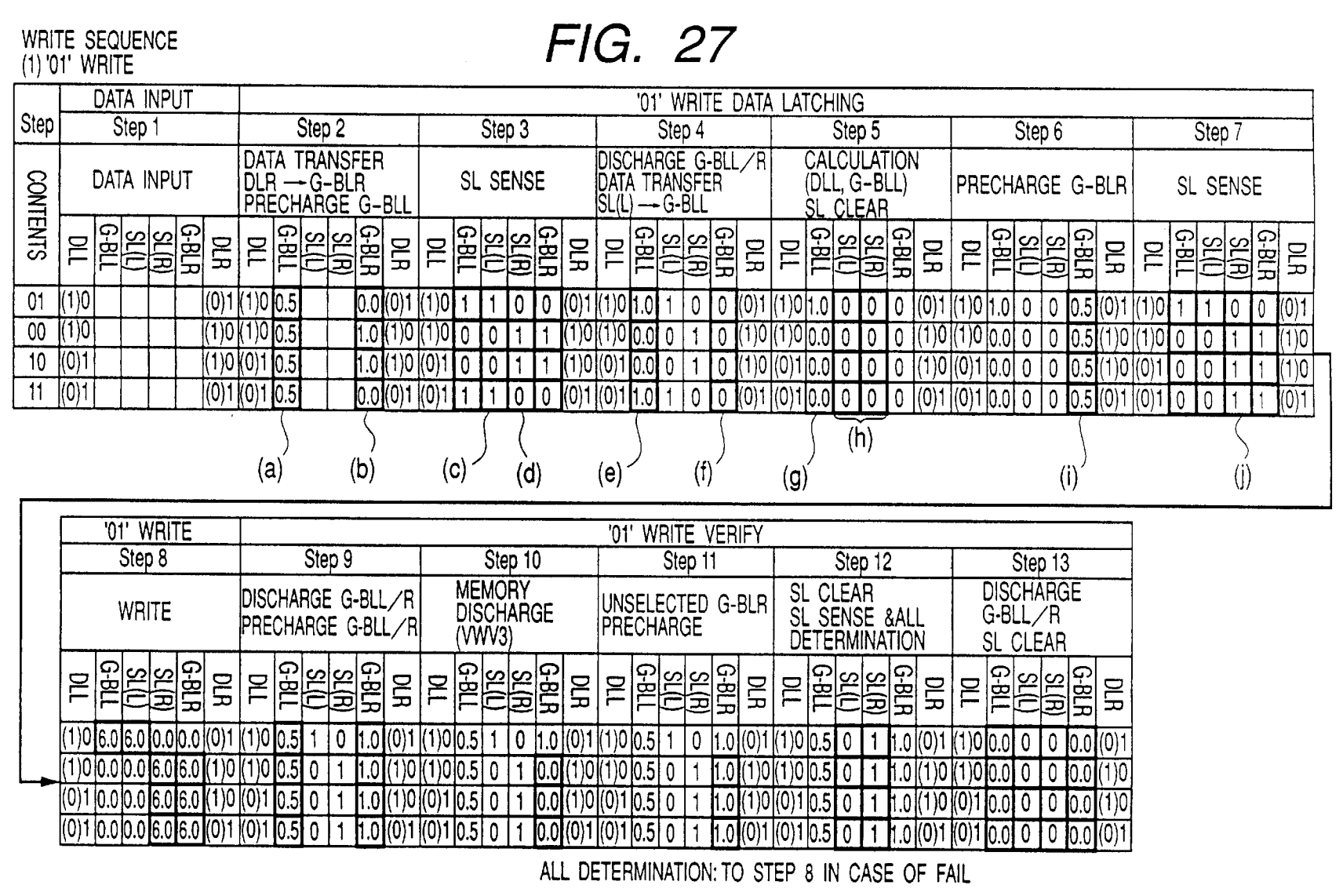

FIG. 27 shows a more detailed operational flow chart for the "01" writing process. FIG. 27 is in the same may of representation as FIG. 26. First, 2 bits of write data are latched in the data latch circuits DLL and DLR (step 1). Four items of latched data, i.e., "01", "00", "10" and "11" are shown. Next, the data in the data latch circuit DLR are transferred to the bit lines G-BLR at the memory mat selected for writing. All of the bit lines at the memory mat unselected for writing are precharged at 0.5 V (step 2). The data transfer is carried out by selectively precharging the in the data latch circuits DLL and DLR are not corrupted and are maintained as they are also in this case.

The process of latching the results of calculations using the 2 bits of write data latched in the data latch circuits DLL and DLR in the sense latch circuit SL (data latching process) uses a different method of calculation in relation to the current processes at TS1 through TS4.

FIG. 21 a logical representation of an example of the calculation at the data latching process. The calculation in FIG. 21 relates to sense latch data at the side of a memory mat selected for operation (data at the input/output node of a sense latch circuit at the side of the memory mat selected for operation). According to this method of calculation, there are three levels of bit line precharge voltages at 0 V, 0.5 V and 1.0 V, and the data of interest are latched in the sense latch circuit SL through a plurality of sense operations of the sense latch circuit SL.

In FIG. 21, A and B represent 2 bits of write data associated with one sense latch circuit SL. A represents the upper data bit latched in the data latch circuit DLL, whereas B represents the lower data bit latched in the data latch circuit DLR. Referring to FIG. 21, a "01" write data latch process performs logical OR operation between the data bit A and inverted data of B; a "00" write data latch process performs a logical OR operation (h).

At step 6, the bit lines G-BLR at the selected memory mat are precharged to 0.5 V (i). The transistors M22R and M22L are turned on at step 7 to activate the sense latch circuit SL for a sense operation. Then, the input/output node SL(R) of the sense latch circuit SL toward the selected memory mat latches the logical value "0" only when "01", is latched in the data latch circuits DLL and DLR.

At step 8, the power supply SLP is set at 6.0 V which is used as a write disabling voltage. When the data latched at the input/output node SLR of the sense latch circuit SL toward the memory mat selected for operation has the logical value "1",the power supply SLP of 6 V is supplied to the bit lines G-BLR through the transistor M22R. When the data latched at the input/output node SLR has the logical value "0", the level of the bit lines G-BLR connected to the input/output node SLR is maintained at 0 V. A write voltage is applied between the drain and control gate of memory cell transistors whose drains are connected to the bit lines at 0 V. At this time, the high electric field required for writing is not generated at the bit lines to which the write disabling voltage of 6.0 V is applied.

After the write voltage is applied, as shown at step 9, all of the bit lines G-BLR at the memory mat selected for operation are precharged at 1.0 V, and all of the bit lines G-BLL at the memory mat unselected for operation are discharged to 0.5 V. At this time, the sense latch circuit SL maintains the data of the logical values latched at the data latching process during writing. Although the data latching process WS12 precedes the verify process WS13 according to the description with reference to FIG. 16, this does not necessarily mean that a data latching process is included which is separate from the data latching process WS10 before the application of a write voltage. The data latching process WS12 may be replaced with the data latching process WS10 which is performed each time a write voltage is applied, which is adopted in the process shown in FIG. 27.

At step 10, a memory cell selecting operation is performed with the verify voltage VWV3. When the threshold voltage of a memory cell has not reached the verify voltage VWV3, the bit line G-BLR of the memory cell discharged to 0.0 V. Thereafter, bit lines GBLR of memory cells unselected for writing at the side of the memory mat selected for operation are precharged at 1.0 V at step 11. Specifically, the input/output nodes of the sense latch circuits SL associated with the memory cells unselected for writing are at the logical value "1", and the transistor M20R that receives this logical value "11", at the gate thereof is turned on to supply 1.0 V from the operation power supply FPC to the bit lines G-BLR. Therefore, when the threshold voltage of memory cells to be written has reached a target voltage, all of the bit lines G-BLR of the memory mat selected for writing are set at the logical value "1". At step 12, the input/output nodes of the sense latch circuit SL are cleared and, thereafter, the state of the bit lines is latched in the sense latch circuit SL to perform the ALL determination. After the ALL determination, the bit lines G-BLR and G-BLL and both input/output nodes of the sense latch circuit SL are cleared to the ground potential (step 13).

Figure 28:
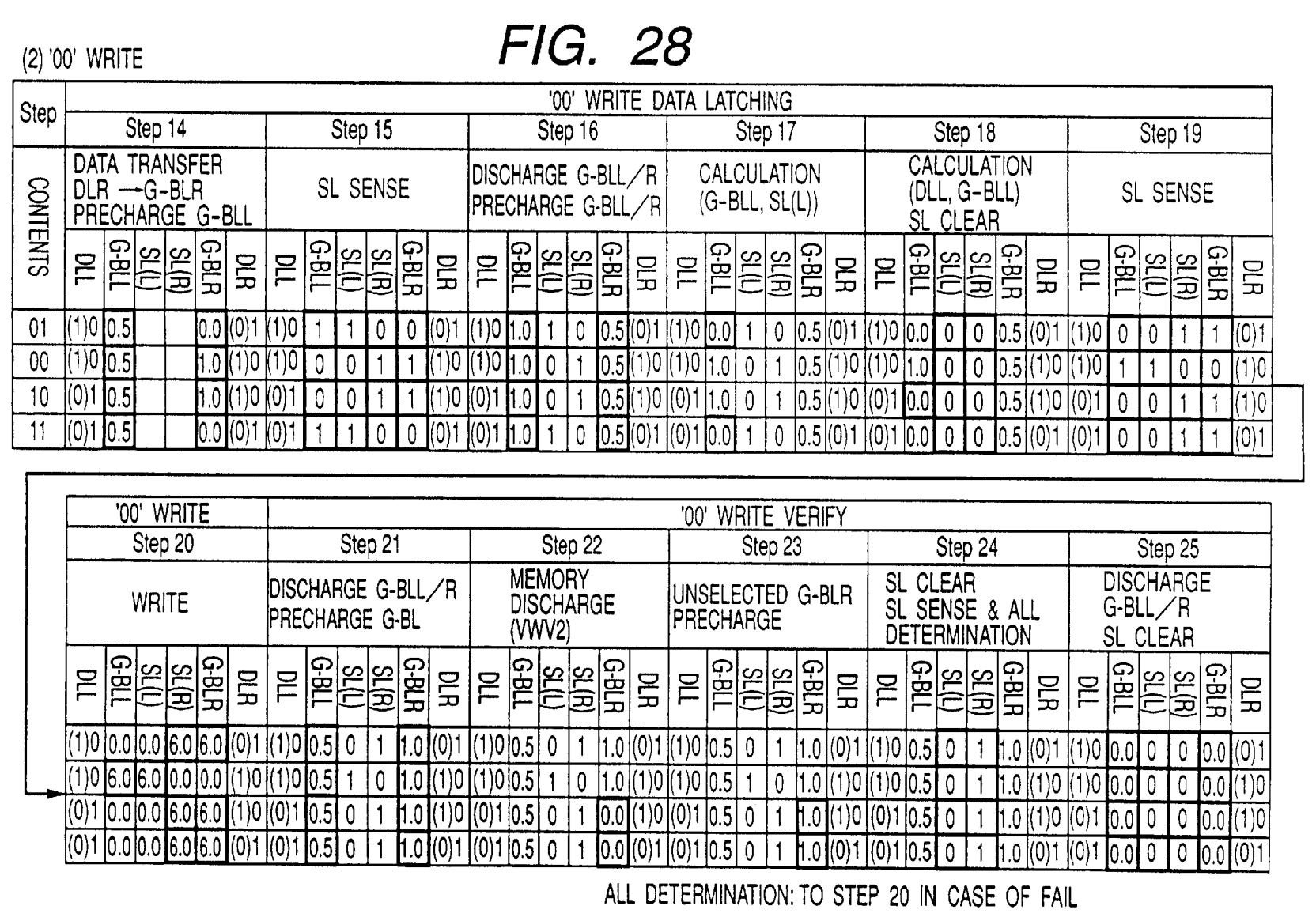
Figure 29:
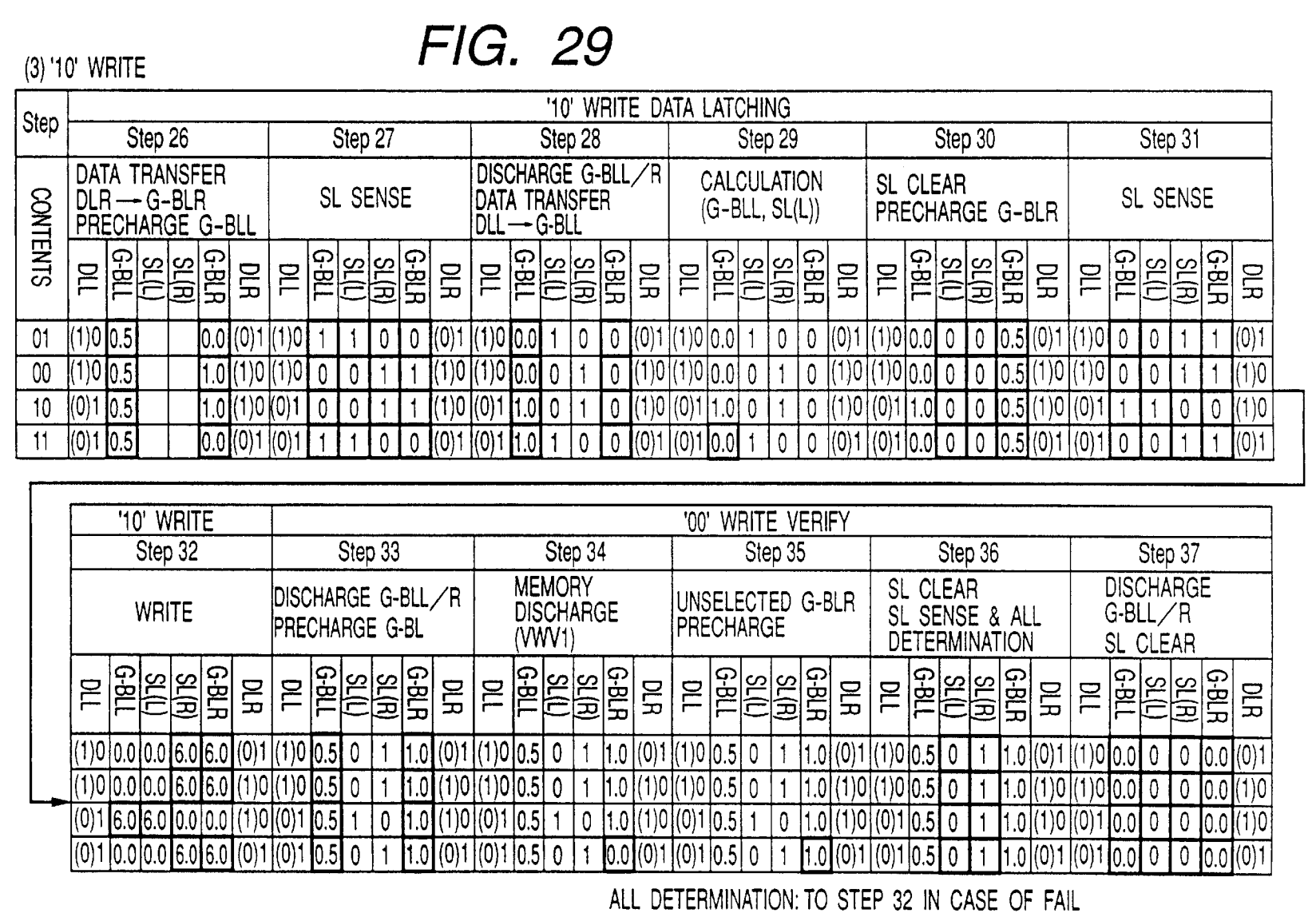

FIG. 28 shows a detailed example of the "00" writing processing and FIG. 29 shows a detailed example of the "10" writing process. The contents of those processes will not be described here in detail because they are different from the "01" writing process only with regard to the data latching process and the difference can be easily understood from the arithmetic logic in FIG. 21.

FIG. 30 shows an example of the "11" word disturb detection process. This process can be generally categorized into a "11" word disturb data latching process comprising steps 38 through 43 and a "11" word disturb detection process comprising steps 44 through 48. The "11" word disturb data latching process is similar to the above-described data latching process and is a process which specifically implements the arithmetic logic illustrated in FIG. 21. The "11" word disturb detection process is similar to the "01" write verify process illustrated in FIG. 27 and will not be described here in detail because it is different therefrom only in that a word disturb detection voltage VWDS is used instead of the verify voltage VWV3.

Figure 31:
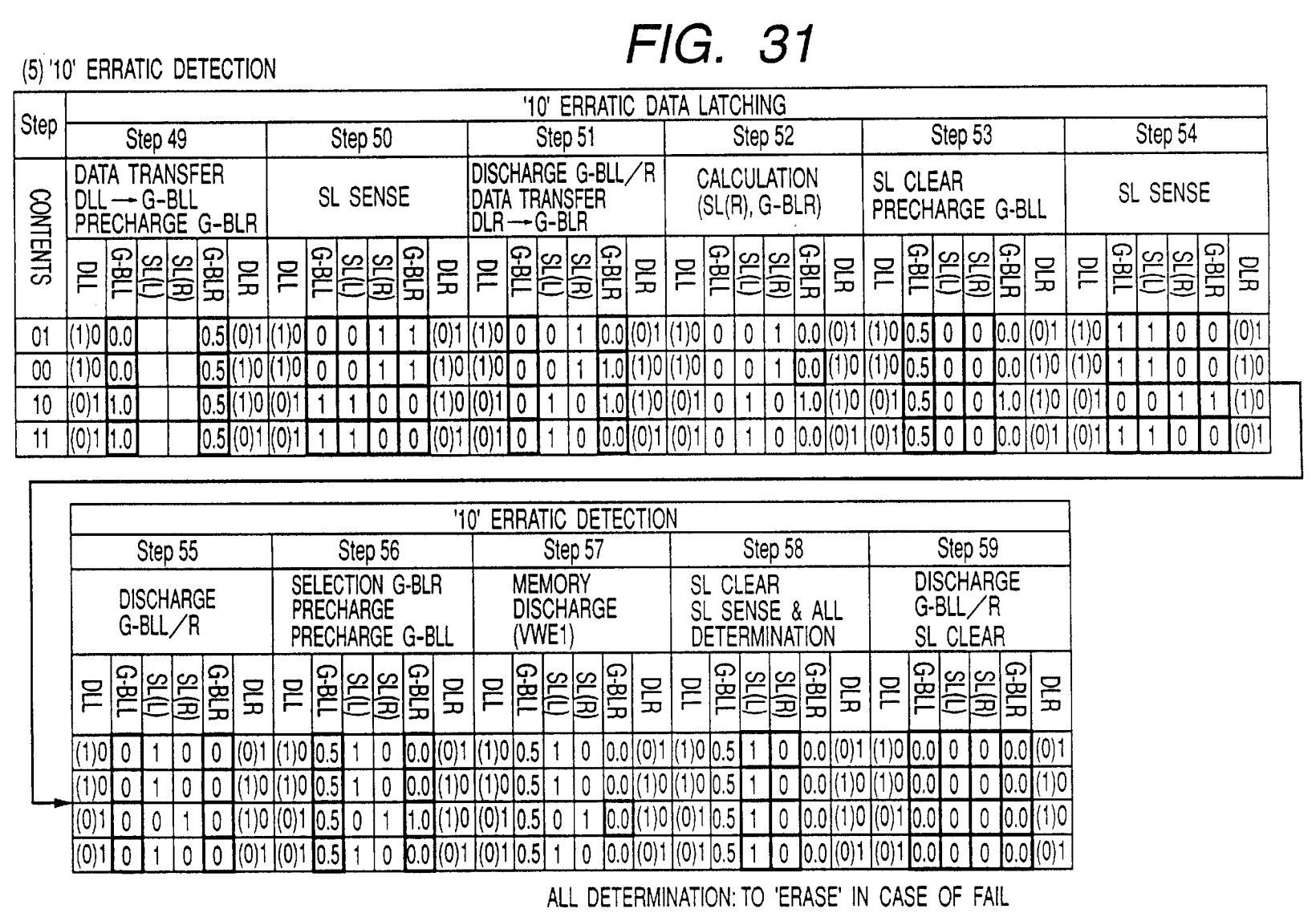
Figure 32:
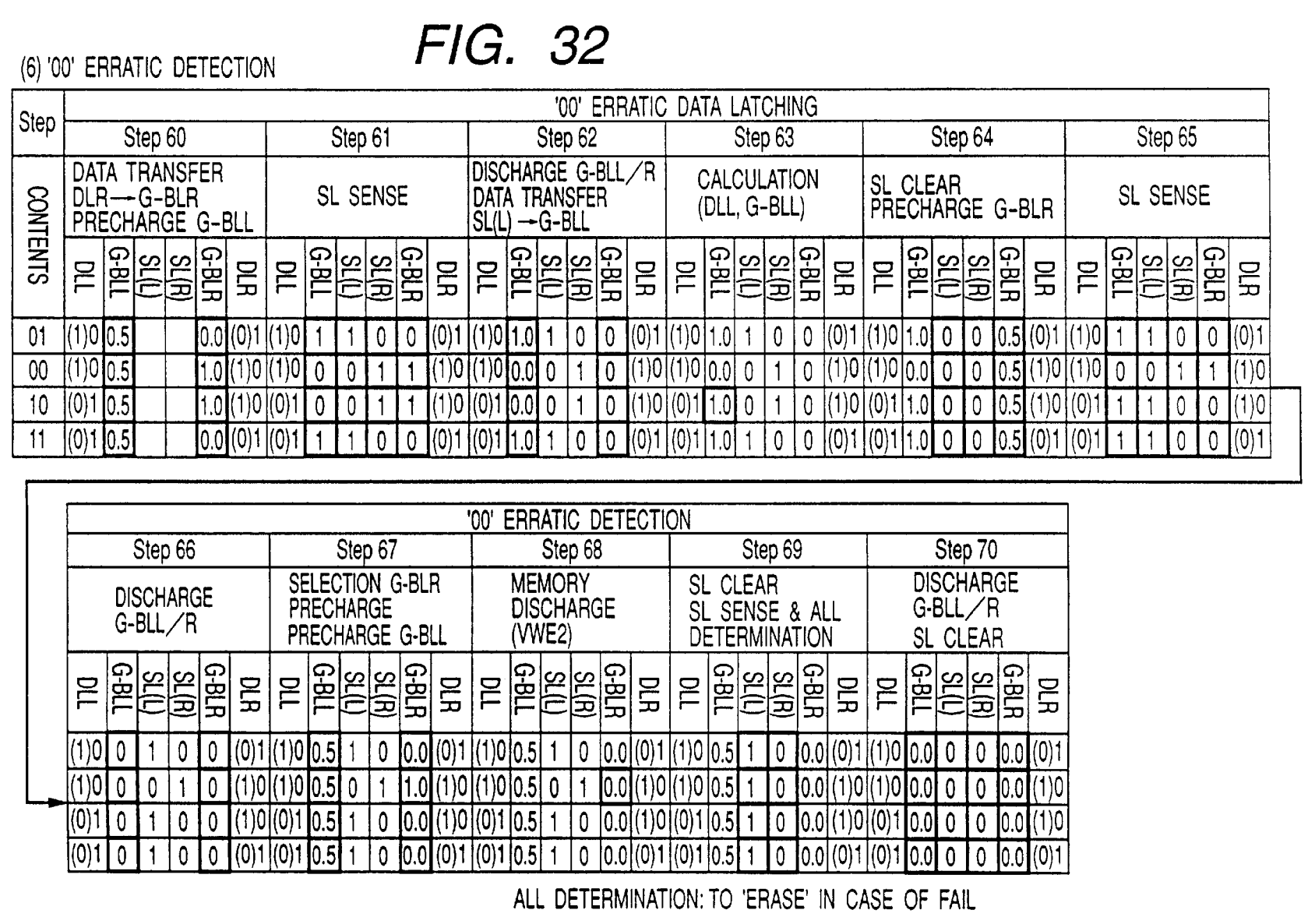

FIG. 31 illustrates the details of the "10" erratic detection process, and FIG. 32 illustrates the details of the "00" erratic detection process. Each of those processes is generally categorized into an erratic data latching process and an erratic detection process. The erratic data latching process is similar to the above-described data latching process and is a process which specifically implements the arithmetic logic illustrated in FIG. 21. The erratic detection process is similar to the "01" write verify process illustrated in FIG. 27 and will not be described here in detail because it is different therefrom only in that erratic detection voltages VWE1 and VWE2 are used instead of the verify voltage VWV3.

(Additional Write Operation)

FIG. 15 also shows a flow chart of an additional write operation. The additional write operation is different from a write operation in the process thereof up to the "01" writing process TS1. The additional writing operation also includes sector writing in which a word line constitutes one unit. Upon receipt of an additional write command, the flash memory fetches the next input as a sector address and fetches an input subsequent to the fetching of the sector address into data latch circuits DLL and DLR as write data (WS3). The fetched sector address is an X-address with which one word line to be supplied with a high voltage for writing is selected. Write data are fetched into data latches DLL and DLR byte by byte with the Y address counter gradually incremented from the initial value thereof. For example, as shown in FIG. 6, the write data are latched in data latch circuit arrays DLLA and DLRA assigned to a pair of memory mats MML and MMR associated with one sense latch circuit array SLA.

After the write data are latched, a logical synthesis process WS4 and an erase back process WS5 are performed and, thereafter, the process from the "01" writing process TS1 through erratic/disturb detection process TS4 are carried out.

Figure 23A:
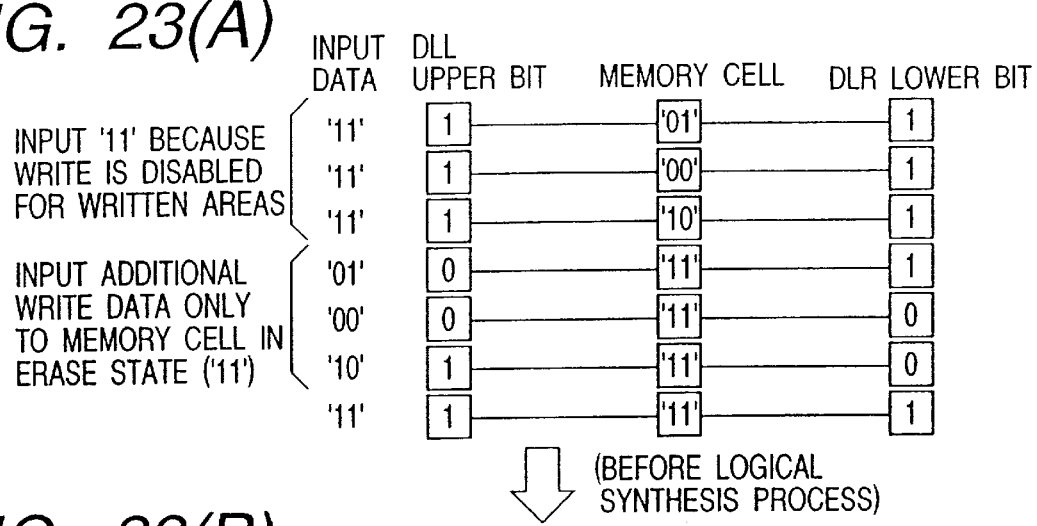
FIGS. 23A through 23C are diagrams which illustrate the concept of additional writing.
Figure 23B:
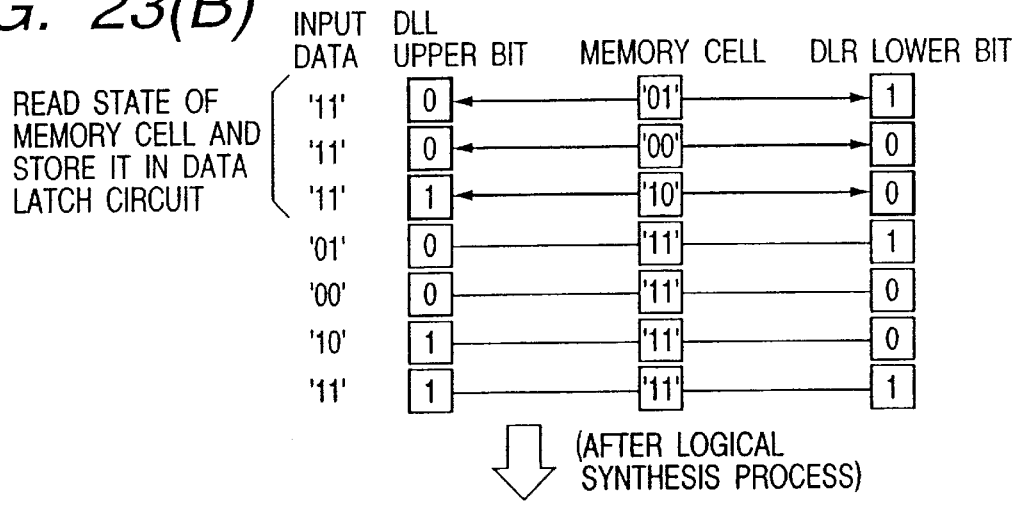
Figure 23C:
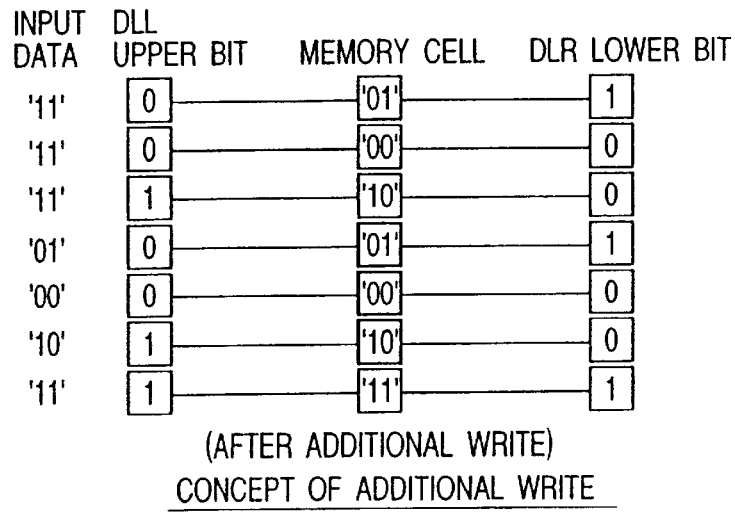

FIGS. 23A through 23C show the concept of additional writing. At additional writing, memory cells to which a write voltage can be applied are memory cells in an erase state. FIGS. 23A through 23C show the states of information stored in the memory cells and data latched in data latch circuits DLL and DLA (logical values at the input/output nodes connected to bit lines).

As shown in FIG. 23A, writing is inhibited in memory cells in a write state, and input data thereto are limited to "11". Writing is permitted only for memory cells in an erase state (storing data "11"). Therefore, data "11" are input to data latch circuits DLR and DLL associated with memory cells in a write state, and desired data "01", "00", "10" and "11" are input to data latch circuits DLR and DLL associated with memory cells in an erase state.

As shown in FIG. 23B, the logical synthesis process logically synthesizes additional write data input to the data latch circuits DLL and DLR and data read from the memory cells to provide data for programming non-volatile memory cells in a write state into the same write state and for programming non-volatile memory cells in an erase state into a write state specified by the additional write data, and the data obtained by the logical synthesis process are latched in the data latch circuits DLL and DLR. As shown in FIG. 23C, a write process is then performed based on the data latched in the data latch circuits DLL and DLR.

Figure 17:
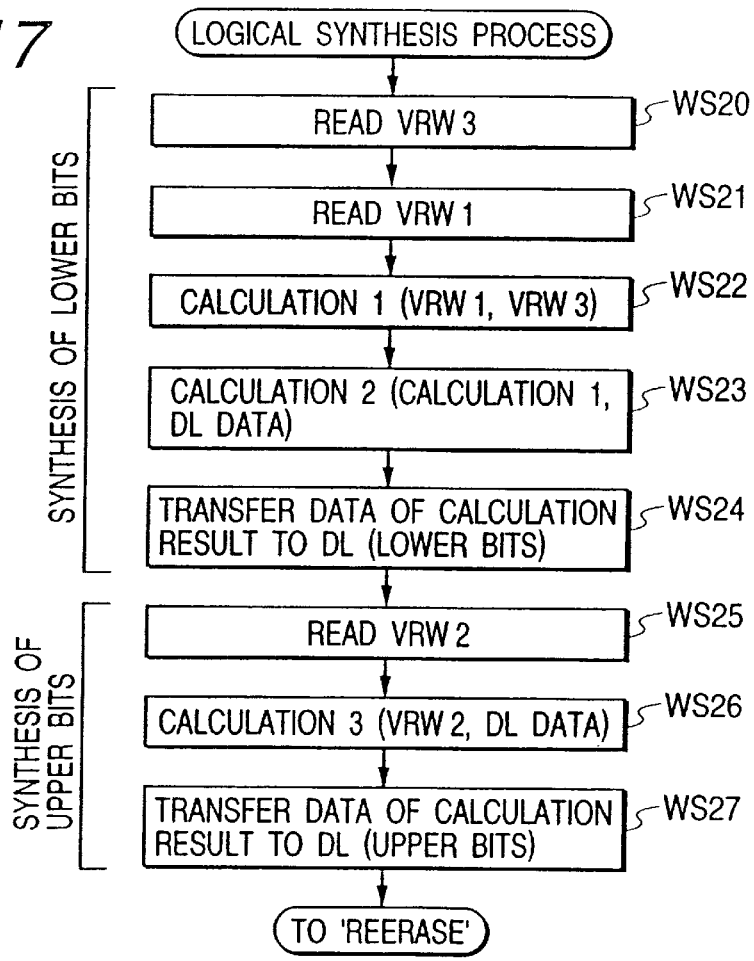
FIG. 17 is a flow chart showing a detailed example of a logic synthesis process included in the additional write operation.

FIG. 17 shows a detailed flow chart of the logical synthesis process. The logical synthesis process starts with synthesis of lower bits. Specifically, reading is carried out with a word line voltage VRW3 (WS20) and the result is latched in the sense latch circuit; reading is carried out with a word line voltage VRW1 (WS21); and a calculation 1 (an exclusive OR or exclusive negative OR operation) is performed on the results of the reads WS20 and WS21 to determine lower bits of information read from the memory cells in a write state (WS22). A calculation 2 (a logical OR operation) is carried out on the write data input to the data latch circuits and the result of the calculation 1 to determine lower bits of the logically synthesized additional write data. The result is transferred to and latched in the data latch circuit DLR (WS24). Referring to the synthesis of upper bits, reading is performed with a word line voltage VRW2 (WS25), and the result is latched in the sense latch circuit. A calculation 3 (an exclusive OR or exclusive negative OR operation) is carried out on the write data input to the data latch circuits and the result of the read WS25 (WS26) to determine upper bits of the logically synthesized additional write data. The result is transferred to and latched in the data latch circuit DLL (WS27).

FIG. 24 shows the contents of lower bits and upper bits obtained by the logical synthesis process WS4 in the form of logical expressions. In FIG. 24, the symbol "/" is used as a sign for logical inversion (a sign which means that the logic of data having the same is inverted). The circled "+" symbol in FIG. 24 is used as a symbol for exclusive OR, and 'EXOR' is used as a symbol for exclusive OR in the specification. The symbol "." is used as a symbol for logical AND. A lower bit is given by a 0./(b1 'EXOR' b3), and a upper bit is given by /a1 'EXOR' /b2. "a0" is the lower bit of the additional write data latched in the data latch circuit DLR. "a1" is the upper bit of the additional write data latched in the data latch circuit DLL. "b1" is the data read from the memory cell with VRW1. "b2" is the data read from the memory cell with VRW2. "b3" is the data read from the memory cell with VRW3.

Figure 25:
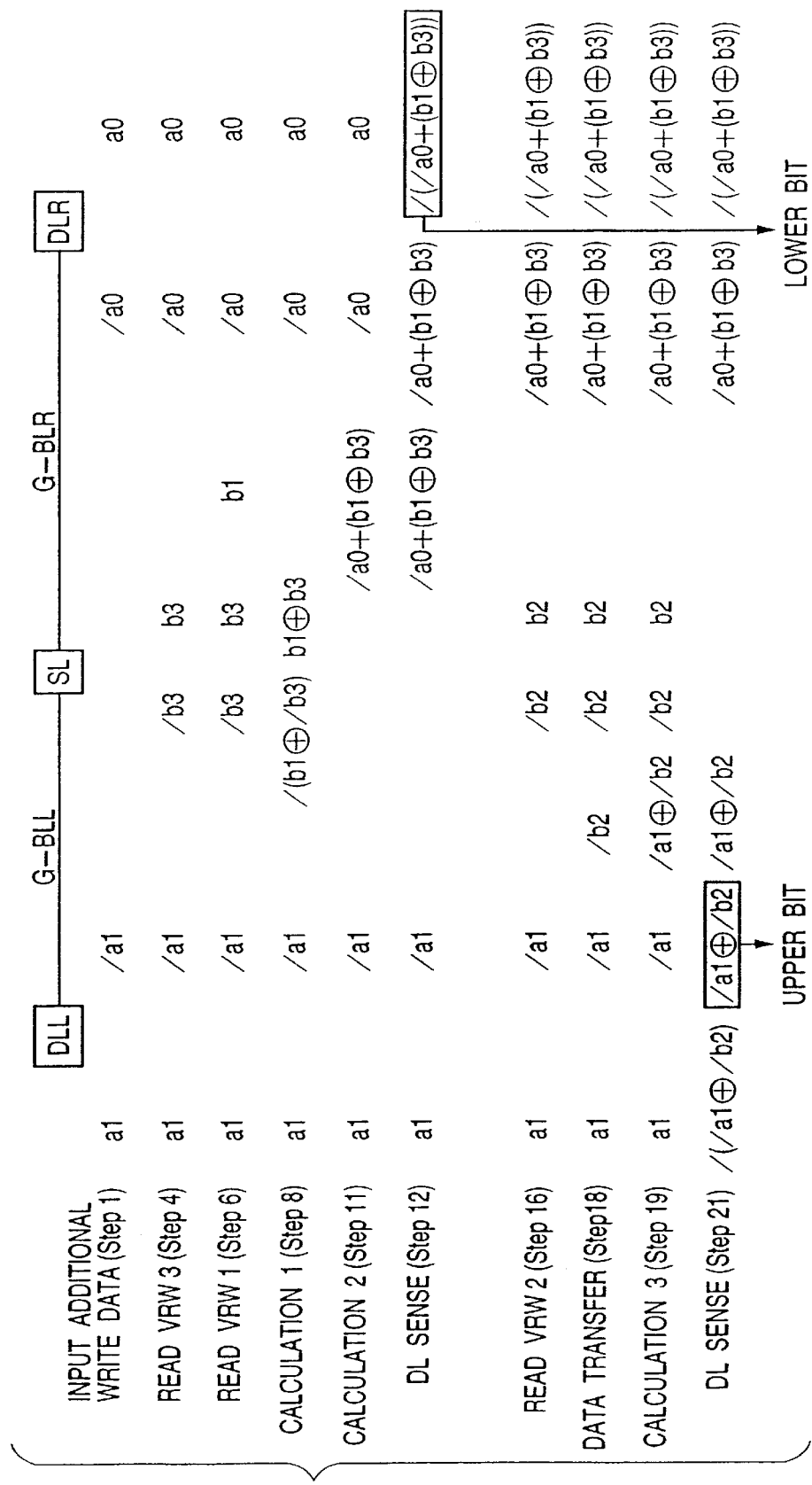
FIG. 25 is a diagram providing a logical illustration of an operation to provide the result shown in FIG. 24 from an additional write process.

FIG. 25 is a logical representation of an operation to obtain the results shown in FIG. 24 at the additional write process. In FIG. 25, the value of each input/output node is shown on the left and right of the sense latch circuit SL and the data latch circuits PLL and DLR. In FIG. 25, the result of VRW3 reading is maintained in the sense latch circuit SL, and the result of VRW1 reading is maintained on the bot line G-BLR. The calculation 1 provides exclusive OR "b1" 'EXOR', b3" of the data b3 latched in the sense latch circuit SL and the data on the bit line G-BLR. The calculation 2 provides a logical OR of the lower bit a0 of the additional write data and the result of the calculation 1, and the logical OR result is latched in the data latch circuit DLR as the lower bit of logically synthesized additional write data. The logical OR "/(/a0+(b1 'EXOR' b3))" can be modified to be equivalent to "a0./(b1 'EXOR' b3))". Next, read data /b2 and b2 as a result of VRW2 reading are maintained in the sense latch circuit SL. The data /b2 is transferred to the bit line G-BLL to be exclusive-ORed with additional write data /a1 by the calculation 3, and the result is latched in the data latch circuit DLL as the upper bit of the logically synthesized additional write data.

Figure 33:
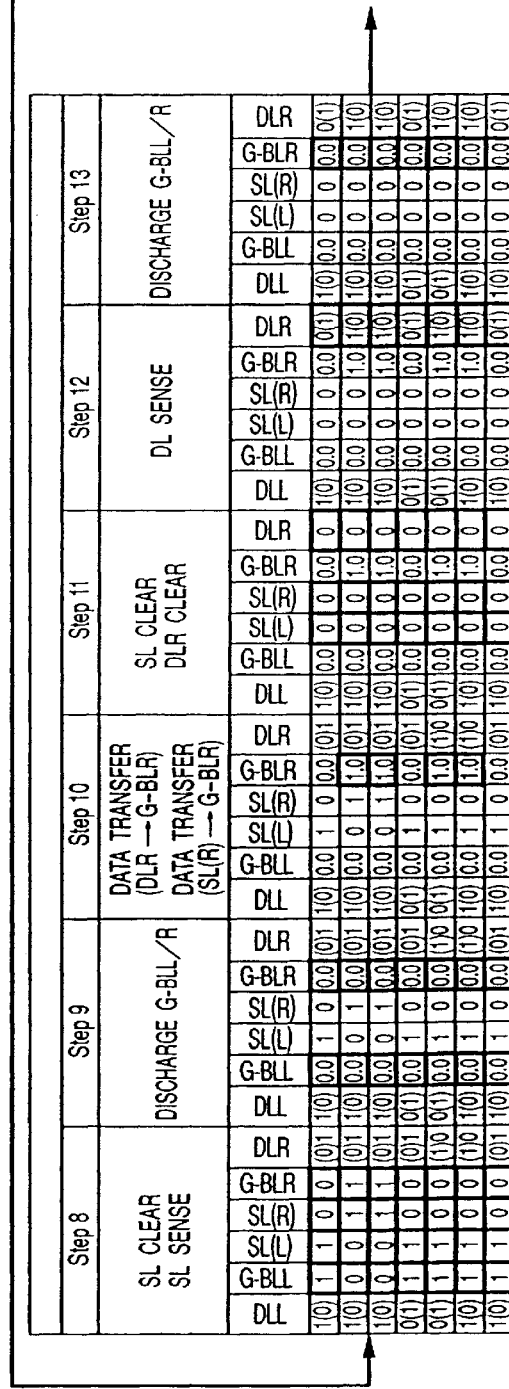
FIG. 33 is a diagram providing a detailed illustration of a process of synthesizing lower bits for additional writing.
Figure 34:
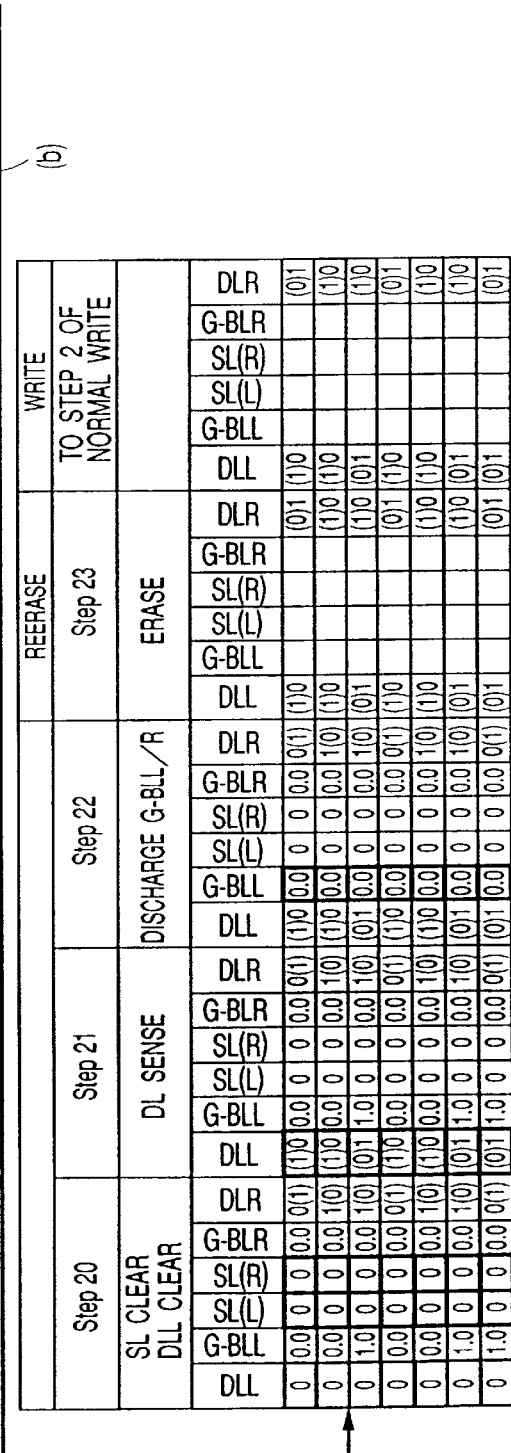
FIG. 34 is a diagram providing a detailed illustration of a process of synthesizing upper bits for additional writing.
Figure 36:
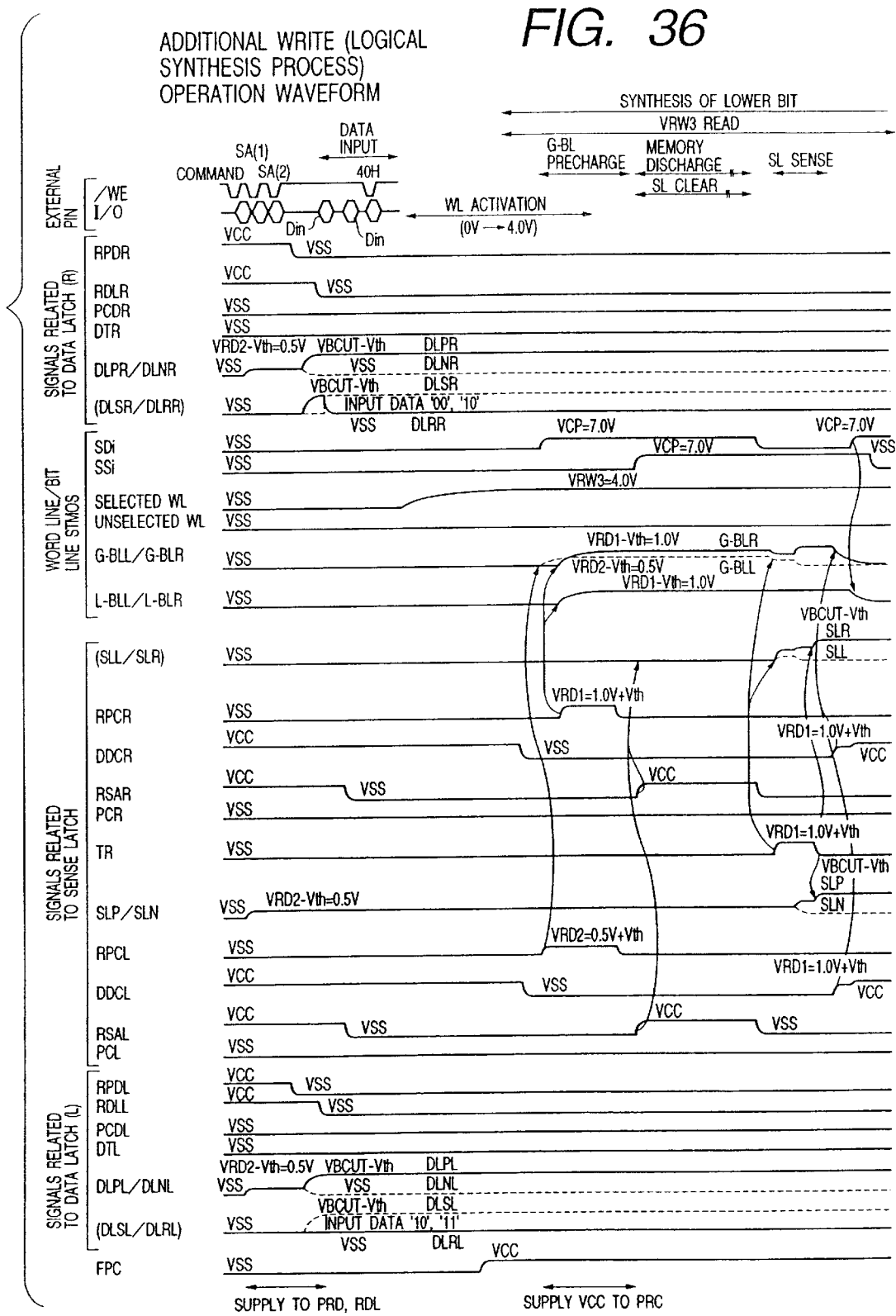
FIG. 36 is a timing chart showing a part of a logical synthesis process during additional writing by means of operational waveforms.
Figure 37:
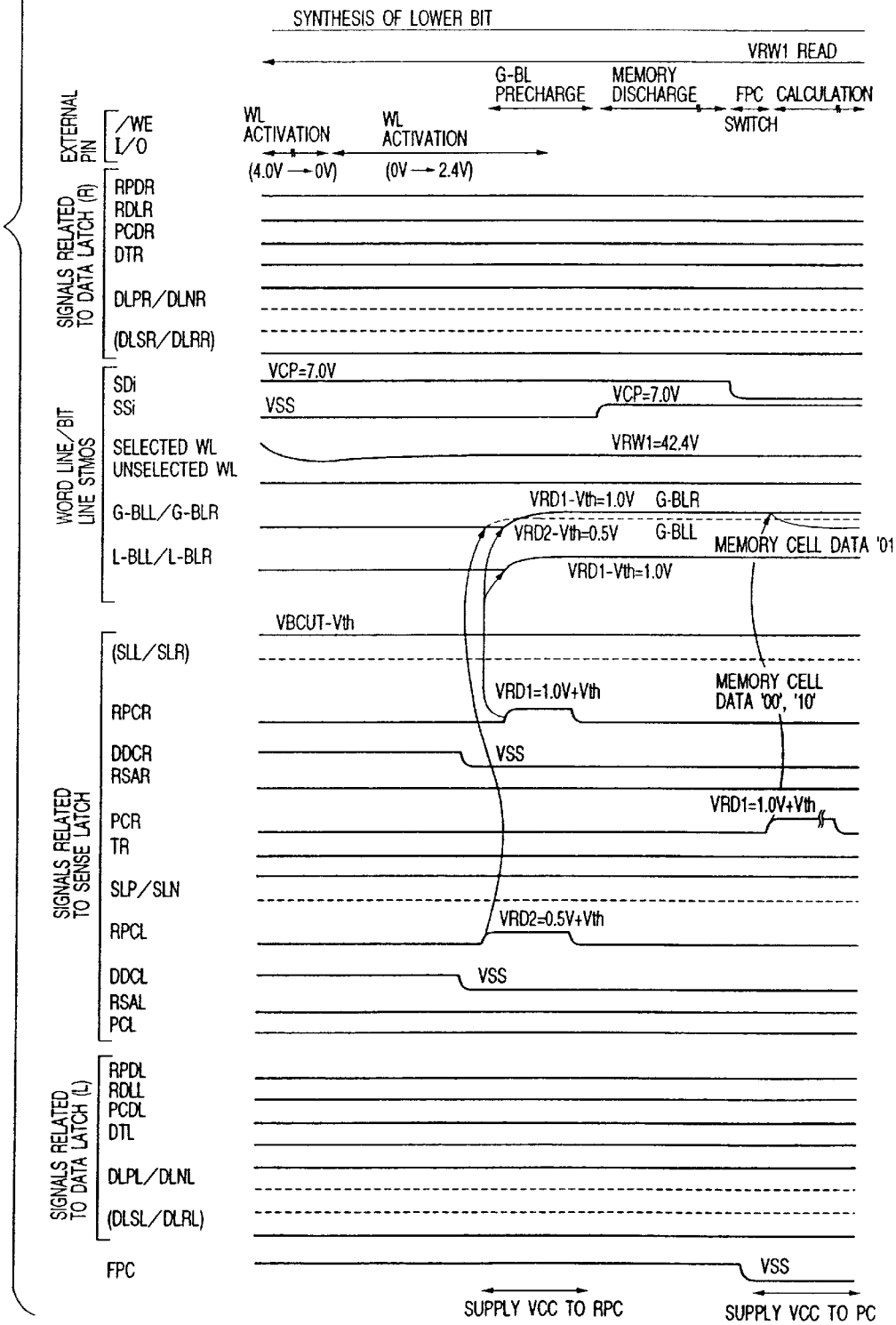
FIG. 37 is a timing chart showing a part of the logical synthesis process during additional writing by means of operational waveforms that are continuation of FIG. 36.
Figure 38:
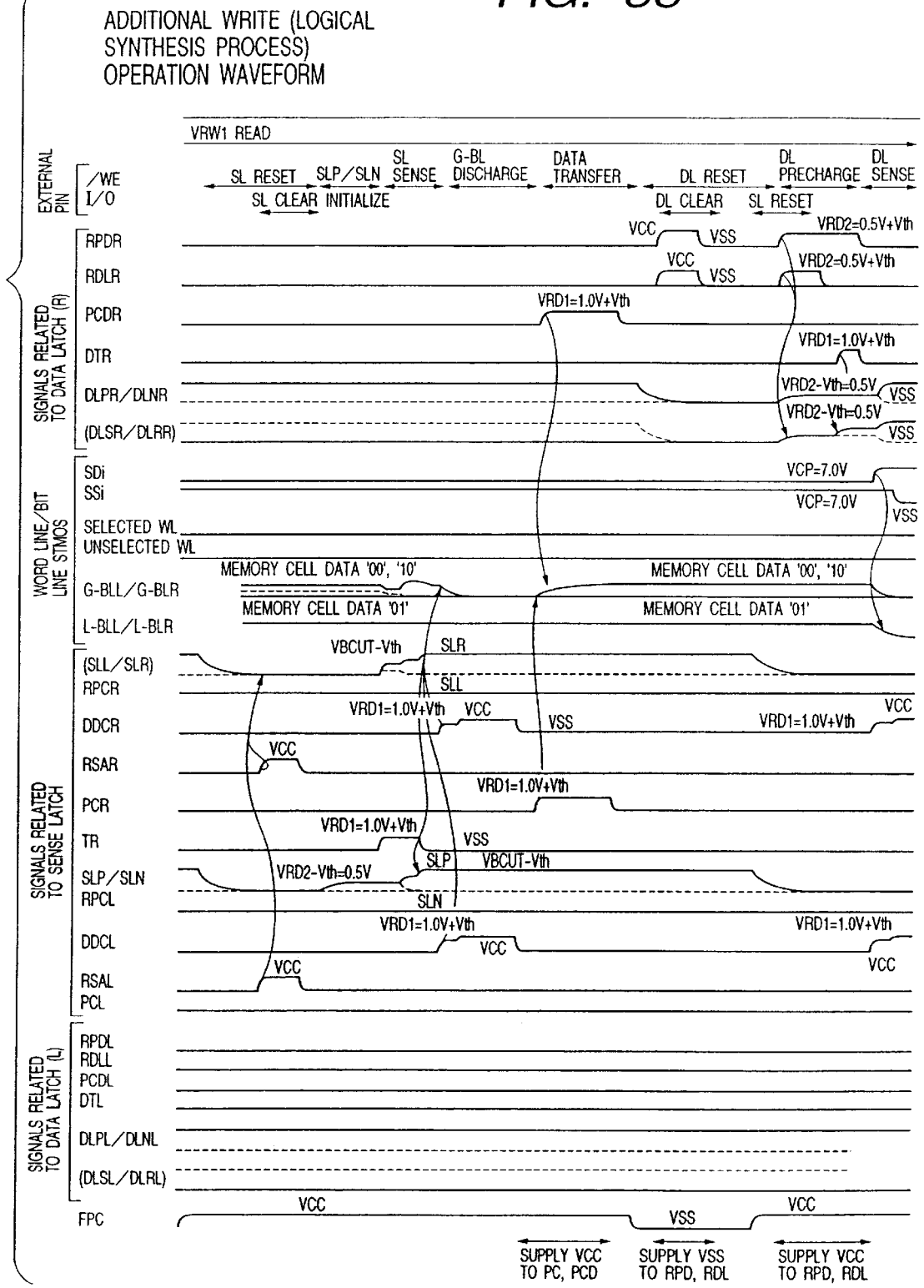
FIG. 38 is a timing chart showing a part of a logical synthesis process during additional writing by means of operational waveforms that are continuation of FIG. 37.
Figure 39:
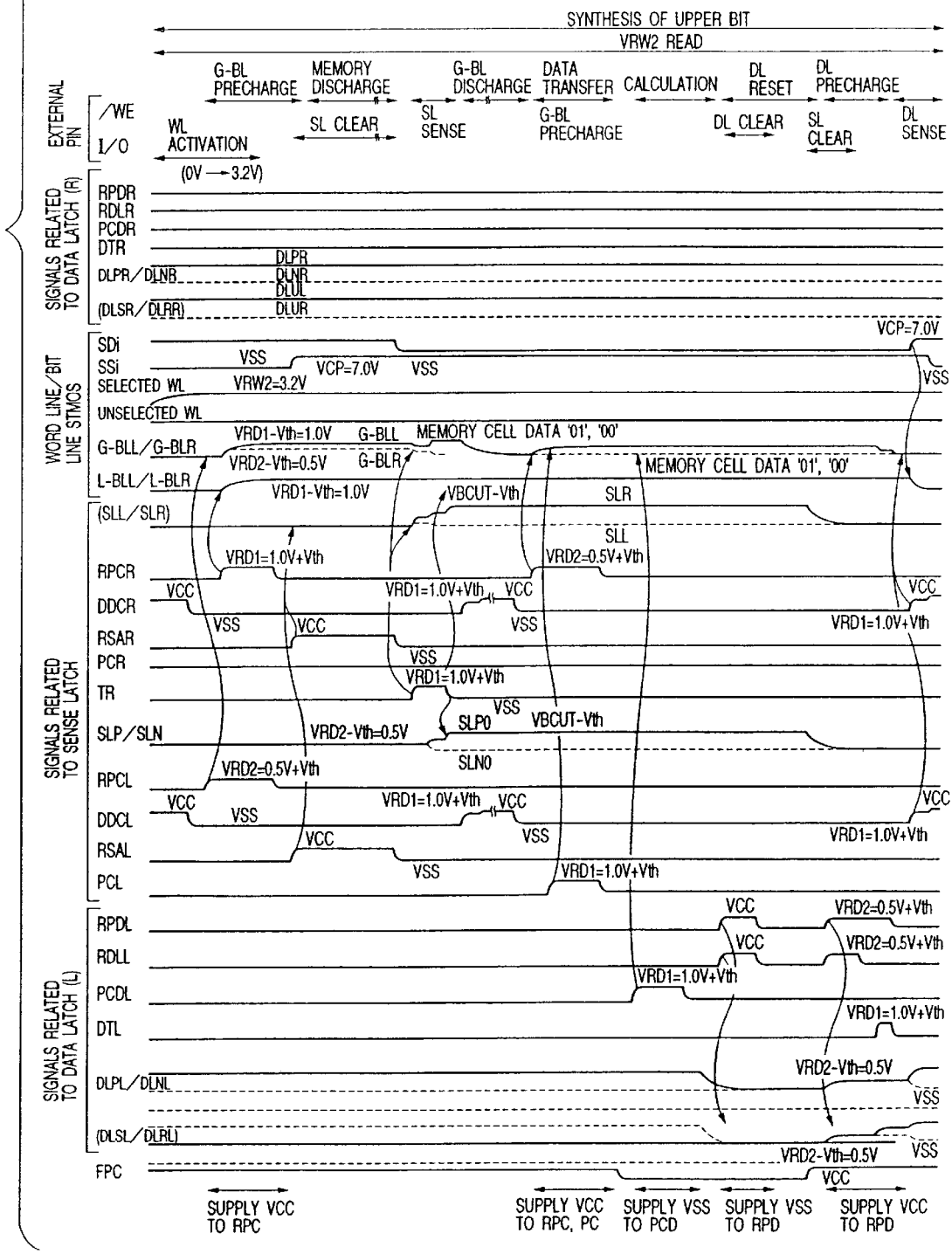
FIG. 39 is a timing chart showing a part of a logical synthesis process during additional writing by means of operational waveforms that are continuation of FIG. 38.

FIGS. 33 and 34 show a more detailed operation flow chart of the additional writing process. FIGS. 33 and 34 are in the same form of representation as FIG. 26. The step numbers shown in FIG. 25 are associated with the step numbers shown in FIGS. 33 and 34.

First, 2 bits of write data are latched in the data latch circuits DLL and DLR (step 1). FIGS. 33 and 34 show all of the seven combinations of information stored in the memory cell and additional write data (combinations described in FIG. 23). The logical values of data input to the data latch circuit DLL of the unselected memory mat at this time are inverted from normally written data. This is to reduce the number of subsequent processing steps. At step 2, the bit line G-BLR at the memory mat selected for operation are precharged at 1 V and the bit lies G-BLL at the memory mat unselected for operation are precharged at 0.5 V as a reference in order to read the data. At step 3, the data in the memory cells are read using the voltage VRW3 which resides between the threshold voltage of "01" data and the threshold voltage of "00" data as a word line selection level. The bit lines of the memory cells having the threshold voltage distributions of data other than the "01" data are discharged. The result is sensed by and latched in the sense latch circuit SL (step 4).

At step 5, the bit lines G-BLR and G-BLL are discharged and, thereafter, the bit lines G-BLR at the memory mat selected for operation are precharged at 1 V and the bit line G-BLL at the memory mat unselected for operation are precharged at 0.5 V. At step 6, the data in the memory cells are read using the voltage VRW1 that resides between the threshold voltage of "10" data and the threshold voltage of "11" data as a word line selection level. The bit lines of the memory cells having the threshold voltage distribution of the "11" data are discharged. The result is sensed by and latched in the sense latch circuit SL (step 4). At step 7, an exclusive OR operation is carried out between the value at the input/output node of SLR of the sense latch circuit SL and the values of the bit lines G-BLR. The exclusive logic works depending on whether the transistor M20R is turned on when the input/output node SLR of the sense latch circuit SL has the value "1" to discharge the bit lines at the value "1" to FPC that results in the value "0". Such discharge occurs at (a) in FIG. 33. As a result, the lower bits of the data read from the memory cells are determined and are latched in the sense latch circuit SL.

Next, after the bit lines G-BLR and G-BLL are discharged at step 9, the lower bits of the logically synthesized additional write data are generated at step 10. Specifically, the data latched in the sense latch circuit SL and the data latched in the data latch circuit DLR of the memory mat selected for operation are transferred to the bit lines G-BLR to perform a logical OR operation between the lower bits of the data read from the memory cells and the lower bits of the additional write data initially loaded in the data latch circuit DLR. The result of this logical OR operation is the lower bits of the logically synthesized additional write data. After the sense latch circuit SL and the data latch circuit DLR are cleared at step 11, at step 12 the lower bits of the logically synthesized additional write data on bit lines G-BLR are latched in the data latch circuit DLR, and the bit lines G-BLR are cleared for the next operation. "Clear" means discharging to the ground potential or "0".

The next operation is a synthesis process on the upper bits. First, at step 14, the bit lines G-BLR at the memory mat selected for operation are precharged at 1 V and the bit lies G-BLL at the memory mat unselected for operation are precharged at 0.5 V as a reference in order to read the data. At step 15, the data in the memory cells are read using the voltage VRW2 which resides between the threshold voltage of "10" data and the threshold voltage of "00" data as a word line selection level. The bit lines of the memory cells having the threshold voltage distributions of the "11" data and "10" data are discharged. The result is sensed by and latched in the sense latch circuit SL at step 16.

Next, after the bit lines G-BLR and G-BLL are discharged at step 17, the value at the input/output node SLL of the sense latch circuit SL toward of the unselected memory mat is transferred to the bit lines G-BLL at step 18. At step 19, an exclusive OR operation is carried out between the values in the data latch circuit DLL and the values of the bit lines G-BLR. The exclusive logic works depending on whether the transistor M26R is turned on when the input/output node DLLR of the data latch circuit DLL has the value "1" to discharge the bit lines at the value "1" to FPC that results in the value "0". Such discharge occurs at (b) in FIG. 34. As a result, exclusive logical OR between the upper bits of the data read from the memory cells and the upper bits of the additional write data initially loaded in the data latch circuit DLL is obtained on the bit lines G-BLL. The result of the exclusive logical OR is the upper bits of logically synthesized additional write data. After the sense latch circuit SL and the data latch circuit DLL are cleared at step 20, at step 21 the upper bits of the logically synthesized additional write data on bit lines G-BLL are latched in the data latch circuit DLL, and the bit lines G-BLL ate cleared for the next operation.

Figure 18E:
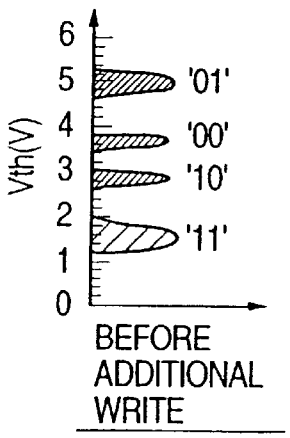
Figure 18F:
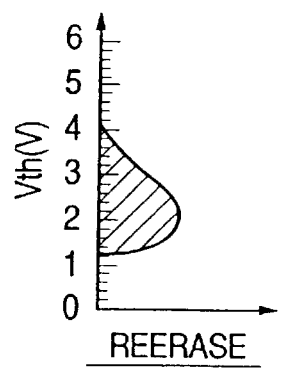

After the upper and lower bits of the logically synthesized additional write data are latched in the data latch circuits DLL and DLR, the sector to be written is subject to an erase back process (step 23). Thereafter, a write process is performed using the data latched in the data latch circuits DLL and DLR. The write process continues to step 2 shown in FIG. 27. The bulk erasuee.is a type' of erasing operation for decreasing the threshold voltages of all memory cells in a sector to be written in order to avoid the effects of a word disturbance (in this case, any undesirable increase of the threshold voltages). While a normal erase operation is a process of repeating the application of an erase voltage and erase verification until the threshold voltages of all memory cells to be erased become equal or lower than a predetermined value, an erase back process can achieve the purpose by applying an erase voltage only once. The erase voltage may be the same as that for a normal erase operation. FIG. 18E illustrates a threshold voltage distribution before additional writing, and FIG. 18F illustrates a threshold voltage distribution after an erase back process.

FIGS. 36 through 39 show examples of operational waveforms at a logical synthesis process during additional writing.

(Erase Operation)

Figure 19:
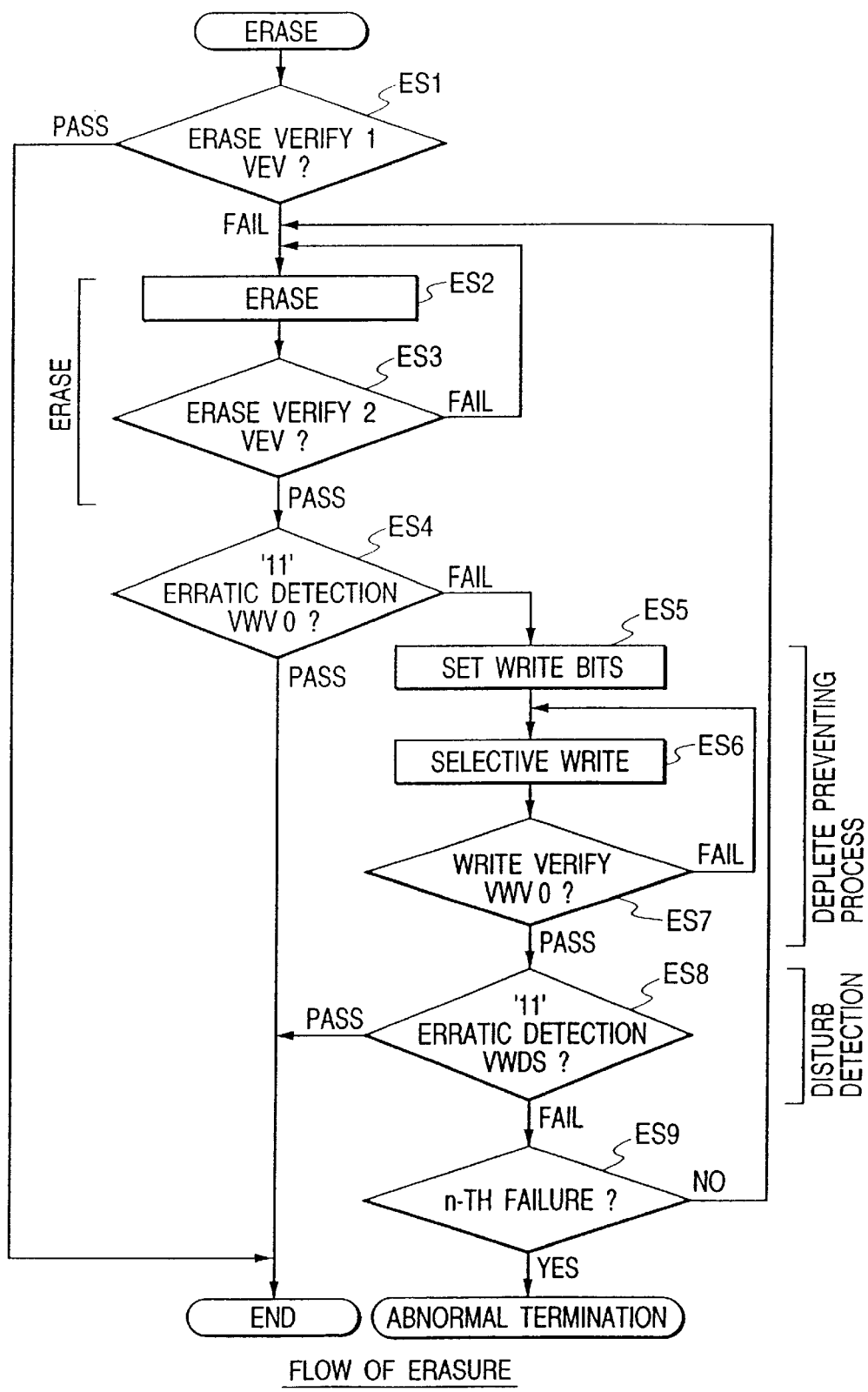
FIG. 19 is a flow chart showing an example of an erase operation.

FIG. 19 shows an example of the erase operation. The erase operation can be performed on each sector as a minimum unit. Upon receipt of a command, the flash memory fetches the next input as a sector address. The fetched sector address is an X-address which allow selection of one word line to which an erase voltage is to be applied. When the erase operation is specified, an erase verify operation (erase verify 1) is first carried out (ES1). When erase is specified for a sector in an erase state, the erasing time can be reduced becappe any redundant operation can be omitted. When the sector is not erased, the erase voltage is applied to the sector to be erased (ES2) to perform an erase verify operation (erase verify 2) on the same (ES3). The process of applying the erase voltage is repeated until the erase verification is passed (until the threshold voltage decreases to VEV or less). When the erase verification has passed, "11" erratic detection is performed (ES4). If the sector fails the erratic detection, write bits are set (ES5); selective writing is performed until the write verification (ES7) has passed (ES6) and the "11" erratic detection is performed on the same writing after the write verification (ES7) has passed (ES8). When the sector fails the "11" erratic detection, the erase operation is redone from the beginning until the number of times of "11" erratic detection reaches a predefined number.

Figure 20A:
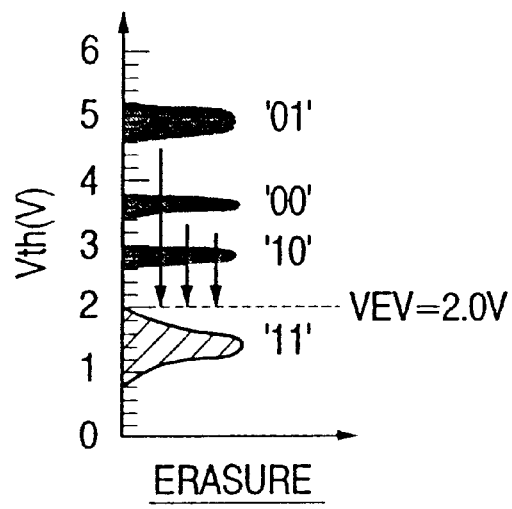
FIGS. 20A and 20B are diagrams which respectively illustrate the application of an erase voltage and a deplete preventing process during an erase operation in the form of threshold voltage distributions of a flash memory cell transistor.

FIG. 20A shows a verify voltage VEV for an erase verify process on a write state and a threshold voltage distribution as a result of an erase operation.

Figure 20B:
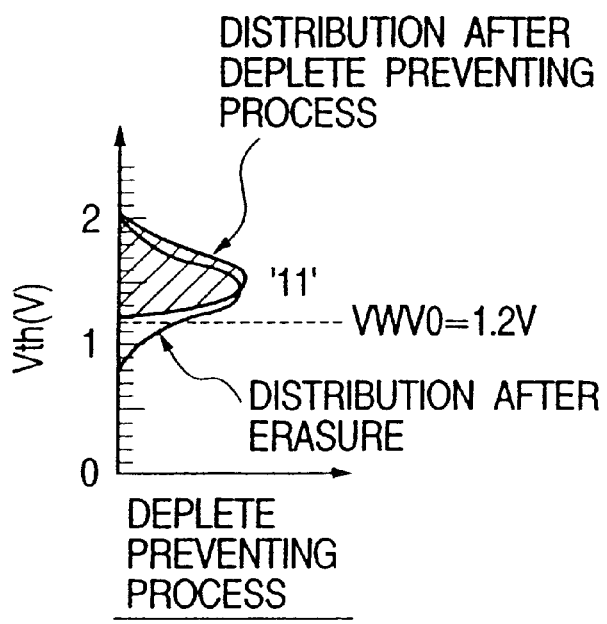

When over-erase is detected at the erratic detection (ES4), a deplete preventing process is performed at ES5 through ES7 to correct the overerased state. FIG. 20B shows an example of a change in a threshold voltage distribution as a result of the deplete preventing process. The erratic detection ES8 is the detection of any undesirable increase in threshold voltages attributable to word line disturb as a result of writing ES6, and the process is redone from the application of the erase voltage when any abnormal threshold voltage attributable to disturb is detected.

FIG. 35 shows a more detailed operation flow chart of the erase operation. FIG. 35 is in the same form of representation as FIG. 26. In FIG. 35, "11" represent memory cells whose threshold voltage is decreased to VEV or less when the erase voltage is applied, and "≦11" represents memory cells whose threshold voltage is decreased to VWVO or less, i.e., memory cells to be subjected to an erase back process to prevent depletion.

At the erase verify 1, the bit lines G-BLR at the memory mat selected for operation are first precharged at 1 V and the bit lies G-BLL at the memory mat unselected for operation are precharged at 0.5 V as reference (step 1). The memory cells at the memory mat selected for operation are then selected with the verify voltage VEV set at, for example, 2.0 V. If the selected memory cells are not in the erase state, the bit lines at the side of the memory mat selected for operation are not discharged (step 2). This state is sensed by the sense latch circuit SL to perform ALL determination thereon (step 3). The illustrated example shows a case in which the memory cells are not erased. After the ALL determination, the bit lines GBLR and G-BLL and the sense latch circuit SL are cleared (step 4). When the erase verify 1 determines that erasure has not been completed, the erase voltage is applied to the memory cells in the sector to be erased (step 5).

At the erase verify 2, the bit lines G-BLR at the memory mat selected for operation are first precharged at 1 V and the bit lies G-BLL at the memory mat unselected for operation are precharged at 0.5 V as a reference (step 6). The memory cells at the memory mat selected for operation are then selected with the verify voltage VEV set at, for example, 2.0 V. If the selected memory cells are in the erase state, the bit lines at the side of the memory mat selected for operation are discharged (step 7). This state is sensed by the sense latch circuit SL to perform ALL determination thereon (step 8). The illustrated example shows a case in which the memory cells are erased. After the ALL determination, the bit lines GBLR and G-BLL and the sense latch circuit SL are cleared (step 9).

Next, the "11" erratic detection is carried out. First, the bit lines G-BLR at the memory mat selected for operation are precharged at 1 V and the bit lies G-BLL at the memory mat unselected for operation are precharged at 0.5 V as reference (step 10). The memory cells at the memory mat selected for operation are then selected with the erratic detection voltage VWV0 set at, for example, 1.2 V. If the selected memory cells are in the over-erased state, the bit lines thereof are discharged (step 11). This state is sensed by the sense latch circuit SL to perform ALL determination thereon (step 12).

In the illustrated example, since discharge is performed at (a), the ALL determination at step 12 reveals a failure. In this case, the write process to prevent depletion is carried out. The values latched in the sense latch circuit SL at step 12 determines whether to apply the write voltage for the write process. Specifically, the sense latch operation at step 12 can be regarded as an example of the write bit setting process (ES5) shown in FIG. 19. At step 13, a write disabling voltage (6.0 V) is applied to the bit lines of the sense latch circuit SL having the logical value "1" at its input/output node SLR toward the memory mat selected for operation to perform selective writing (step 13). Next, for verification, the bit lines G-BLR at the memory mat selected for operation are precharged at 1 V and the bit lies G-BLL at the memory mat unselected for operation are precharged at 0.5 V as a reference (step 14). The memory cells at the memory mat selected for operation are then selected with the write verify voltage VWV0 set at, for example, 1.2 V. If the selected memory cells are in the over-erased state, the bit lines thereof are discharged (step 15). This state is sensed by the sense latch circuit SL to perform ALL determination thereon (step 16).

Finally, in order to detect a "11" erratic attributable to a "11" word disturbance, the bit lines G-BLR at the memory mat selected for operation are precharged at 1 V and the bit lies G-BLL at the memory mat unselected for operation are precharged at 0.5 V as a reference (step 17). The memory cells at the memory mat selected for operation are then selected with the disturb detection voltage VWDS set at, for example, 2.3 V. If the threshold voltage of the selected memory cells is equal to or lower than the disturb detection voltage VWDS, the bit lines thereof are discharged (step 18). This state is sensed by the sense latch circuit SL to perform ALL determination thereon (step 19). The example at step 19 shows a case wherein there is no effect of disturbance which corresponds to the state in which the "11" erratic detection ES8 in FIG. 19 has been passed. Finally, the sense latch circuit SL and the bit lines G-BLL and G-BLR are cleared at step 20.

FIG. 12 collectively shows various voltage conditions for the respective modes of operation of the flash memory described above. Referring to FIG. 12, the word line voltage for reading "11" data is 2.4 V; the word line voltage for reading "10" data is 3.2 V; the word line voltage for reading "00" data is 4.0 V; the word line voltage for writing "10" data is 15.1 V; the word line voltage for writing "00" data is 15.8 V; the word line voltage for writing "01" data is 17.0 V; the word line voltage for verifying "10" data is 2.8 V; the word line voltage for verifying "00" data is 3.6 V; the word line voltage for verifying "01". data is 4.5 V; the voltage for detecting "11" word disturb is 2.3 V; the voltage for "10" erratic detection is 3.1 V; and the voltage of "00" erratic detection is 3.9 V.

(Flash Memory Card)

Figure 40:
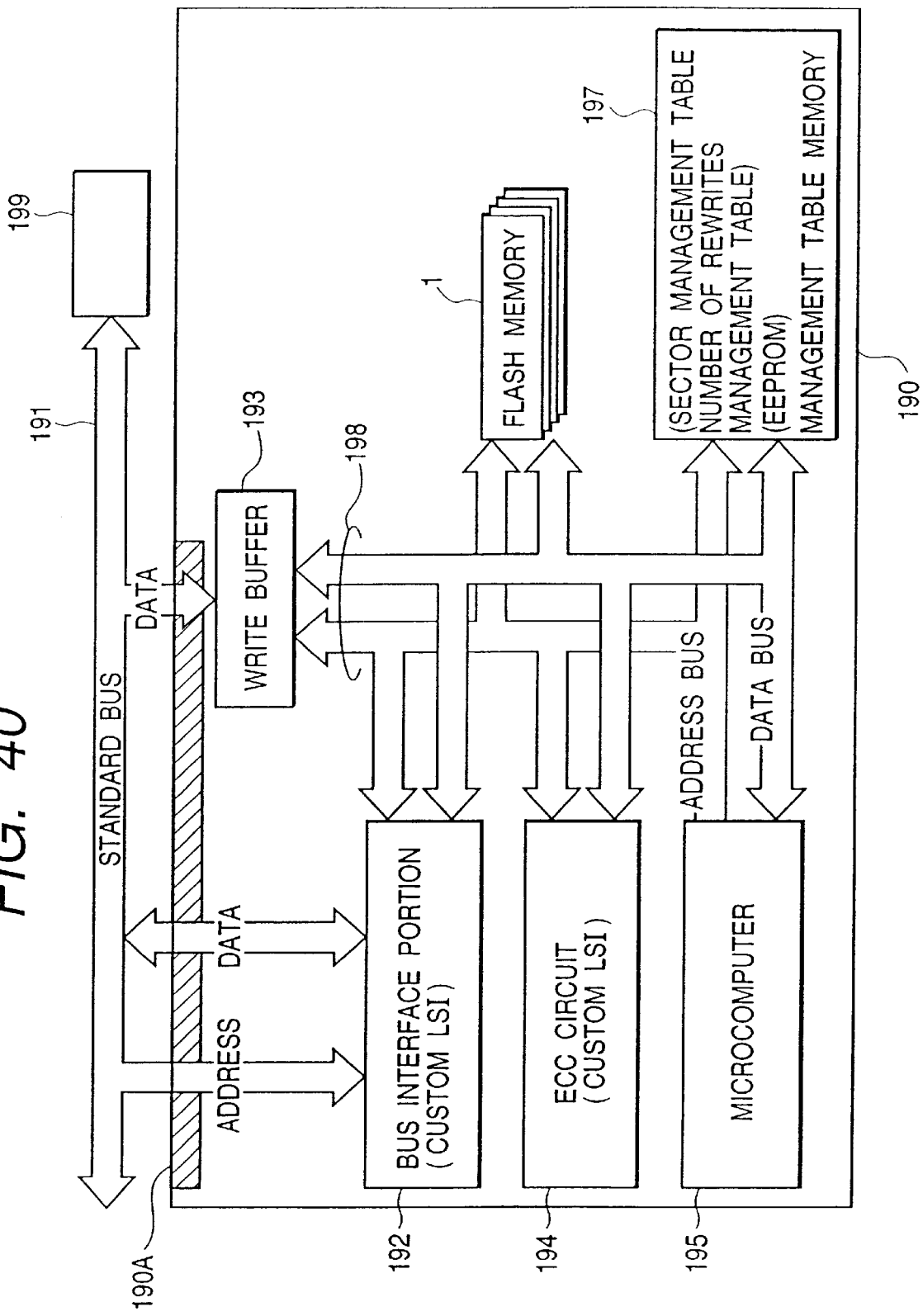
FIG. 40 is a block diagram of a file memory system utilizing a four-valued flash memory.

FIG. 40 shows a block diagram of an example of a file memory system utilizing a flash memory 1 as described above. 190 represents a flash memory card in the form of a PC card which is a kind of ATA (AT attachment) card, although the invention is not limited thereto. The flash memory card 190 can be detachably attached to a computer 199 such as a personal computer through a connector 190A over a standard bus 191 in compliance with IDE (integrated device electronics) standards, although the invention is not limited thereto.

The flash memory card 190 has a bus interface portion 192, a write buffer 193, an ECC circuit 194, a microcomputer 195, a flash memory 1 and a management table memory 197 which are commonly connected to an internal bus 198.

The bus interface portion 192 controls an interface with the standard bus 191 in accordance with the specification of an ATA card or the like. The write buffer 193 is a da7ta buffer for temporarily storing write data supplied over the standard bus 191, and the data accumulated in the write buffer 193 are written in the flash memory 1. The ECC circuit 194 is a circuit having an error checking and correcting function to improve the accuracy of the data stored in the flash memory 1. The management table memory 197 is constituted by an electrically rewritable semiconductor memory such as a flash memory or an EEP ROM and includes a sector management table and the like formed therein. The microcomputer 195 controls the interior of the flash memory card 190 as a whole in accordance with a request for access to the card. For example, it controls access to the flash memory 1 by issuing operational instructions and the above-described commands to the flash memory 1 and controls the management table memory 197.

The following effects can be achieved with the flash memory, memory card and data processing system described above.

[1] Externally supplied write data are latched in the data latch circuit DLL and DLR, and a determination is made at each of a plurality of steps of the write operation to see to which of multi-valued thresholds the latched write data corresponds. Write information as a result of the determination is latched in the sense latch circuit SL, and a write operation is performed in several steps to set multivalued threshold voltages in the memory cell in accordance with the write information latched in the sense latch circuit SL. As a result, even after the completion of a write operation, the data latch circuits DLL and DLR still hold the write data initially supplied from the outside. Therefore, when multi-valued information is written again to the memory cell MC according to the result of word disturb detection or erratic detection as described above, it is not required to receive write data again from the outside.

[2] Additional writing in the flash memory 1 is performed through the input of additional write data ES3, the logical synthesis process WS4 on data read from the memory cells and the additional write data, the erase back process WS5 and the writes TS1 through TS4. Based on the additional write data input to the data latch circuits DLR and DLL and the data read from the memory cells MC, the logical synthesis process WS4 generates data for programming non-volatile memory cells in a write state into the same write state and non-volatile memory cells in an erase state into the write state specified by the additional write data and latches the generated data in the data latch circuits DLR and DLL. Thus, logically synthesized data remain in the data latch circuits DLR and DLL even after the additional write operation. By maintaining the data of the result of the logical synthesis process in the data latch circuits DLR and DLL until the write operation is completed, the latched data can be reused against abnormal writing to eliminate the need for receiving the write data again from the outside when the additional write operation is performed again. Therefore, a processor or the like that controls access to the flash memory 1 is not required to hold write data in a work memory or the like for a certain period of time after a write operation on the flash memory. This makes it possible to improve the efficiency of access to the flash memory 1 and the data processing associated with memory access.

[3] After the data obtained by the logical synthesis process are latched in the data latch circuits DLR and DLL, a write operation on non-volatile memory cells in accordance with the data as a result of the logical synthesis process latched in the data latch circuits DLR and DLL is preceded by an erase operation (erase back or weak erase) performed on the non-volatile memory cells to be written. Thus, even in the case of additional writing, the memory cells are substantially put in an erase state immediately before the additional writing. This makes it possible to eliminate restrictions on the number of additional writes within the range of endurance to rewriting, thereby improving the reliability of additionally written data.

[4] Data latched in the data latch circuits DLL and DLR each time a write voltage is applied are used to determine whether the state of a threshold voltage as a result of the application of the write voltage has reached a target state of the threshold voltage (WS12 and WS13). As a result, even when a write verify operation provides an erroneous determination that a desired threshold voltage has been reached at the initial stage of writing or the like, the failure can be checked to allow rewriting.

[5] The execution of the erratic/disturb detection after writing makes it possible to detect any abnormality in a threshold voltage distribution attributable to writing.

[6] When multi-valued information is stored in the non-volatile memory cells, the erratic/disturb detection first detects word disturbances that result in over-write failures with high probability. This makes it possible to reduce the processing time spent before the detection of any failure.

[7] By performing write back on memory cells in an over-erased state in order to prevent depletion, the threshold voltages of memory cells in an erase state can be at a predetermined voltage or more. By performing disturb detection after the write back to prevent depletion, abnormal threshold voltages can be detected. These features make it possible to provide memory cells in an erase state with a uniform threshold voltage distribution.

[8] Erase verify is performed prior to erasure to erase only sectors which fail the verification. This makes it possible to eliminate waste of time associated with an erase operation.

While the present invention has been specifically described with reference to preferred embodiments thereof, the present invention is not limited thereto and may obviously be modified in various ways within the scope of the principles thereof.

For example, information held in one memory cell is not limited to four values and may comprise a greater number of values. For example, eight values can be accommodated by increasing the number of data latch circuits connected to a bit line. Further, the method of calculation for data latch processing is not limited to that described above and may be changed as needed. It is also possible to change the number of memory mats, the conditions for the write voltages, the conditions for the erase voltage and the conditions for the verify voltage as needed. An erase state and a write state may be defined in a way which is the reverse of that described above. The memory mats of the flash memory are not limited to the AND type and may have other structures, such as the NOR type, DiNOR type and NAND type.

The semiconductor devices according to the invention are not limited to memory chips such as flash memories, and the invention has a wide range of application in semiconductor devices for data processing or logical operations such as microcomputers incorporating a flash memory. The present invention can be also applied to EEPROMs.

Effects that can be achieved by typical aspects of the invention disclosed in this application can be briefly described as follows.

Since multi-valued information is written in individual cells, write data externally supplied to the data latch circuits will not be lost as a result of a write operation. Since the write data supplied initially from the outside therefore remain in the data latch circuits even after a write operation, it is not necessary to receive the write data again from the outside even when the operation of writing multi-valued information in the memory cells is to be performed again as a result of word disturb detection or erratic detection.

There is no need for receiving write data again from the outside even when the operation of writing multi-valued information in the memory cells is to be performed again.

Logical synthesis is performed on data read from the memory cells and additional write data, and additional writing is performed by latching the result of the logical synthesis in the data latch circuits. Therefore, even after the additional writing operation is completed, logically synthesized data will remain in the data latch circuits.

Since the result of the logical synthesis is held in the data latch circuits until additional writing is completed, it is not necessary to receive write data again from the outside when a rewrite is carried out to deal with an erratic write abnormality. The efficiency of memory access or data processing including memory access in a semiconductor device can be improved also in this respect.

Since erase back (weak erase) is carried out before the application of a write voltage for additional writing, restrictions on the number of additional writes can be eliminated within the range of endurance to rewriting.

By performing determination at each write verify operation using initial data in the data latch circuits, even if an erroneous determination that a desired threshold voltage has been reached is made as a result of a write verify operation at an early state of writing or the like, such a failure can be checked to allow rewriting.

By executing the erratic/disturb detection after writing, any abnormality in a threshold voltage distribution can be detected. When multi-valued information is stored in non-volatile memory, the erratic/disturb detection first detects word disturbs that result in over-write failures with high probability. This makes it possible to reduce the processing time spent before the detection of any failure.

After erasure by performing write back on memory cells in an over-erased state in order to prevent depletion, the threshold voltages of memory cells in an erase state can be at a predetermined voltage or more.

By performing disturb detection after write back to prevent depletion, abnormal threshold voltages can be detected.

Erase verify is performed prior to erasure to erase sectors with a failure. This makes it possible to eliminate waste of time during the erase operation.

What is claimed is:

1. A non-volatile memory system comprising:

a controller;

a non-volatile memory device comprising a plurality of non-volatile memory cells and a data latch circuit; and an interface circuit, wherein said controller receives data from outside of the non-volatile memory system via said interface circuit, wherein said controller supplies a plurality of commands to said non-volatile memory device, said commands including a first write command and a second write command, wherein each of said non-volatile memory cells has one threshold voltage within one of at least three of threshold voltage distributions, one of said three threshold voltage distributions indicating an erase state and the other two of said three threshold voltage distributions indicating program states, wherein said non-volatile memory device stores said data in said data latch circuit and then stores said stored data in ones of said non-volatile memory cells, when said controller supplies said first write command, wherein said non-volatile memory device reads out first data from ones of said non-volatile memory cells to said data latch circuit, stores said data in said data latch circuit and then stores said stored data in said ones of non-volatile memory cells, when said controller supplies said second write command, and wherein said data latch circuit is read and stores data indicating an erase state before storing said data received by said controller.

2. A non-volatile memory system according to claim 1, wherein said non-volatile memory device further comprises a verify circuit, and wherein said non-volatile memory device erases data stored in said ones of non-volatile memory and stores said stored data in said data latch circuit into said ones of non-volatile memory cells again, when said verify circuit detects that said threshold voltage of at least one non-volatile memory cell is out of a threshold voltage distribution that correspond to having to stored data in said non-volatile memory cell after storing data in said ones of non-volatile memory cells.

3. A non-volatile memory system according to claim 2, wherein said non-volatile memory device erases data stored in said ones of non-volatile memory cells before storing said data in said ones of non-volatile memory cells.

4. A non-volatile memory system according to claim 3, wherein said data latch circuit comprises a plurality of data latches, and wherein one non-volatile memory cell connects to two data latches.

5. A non-volatile memory system comprising:

a controller;

an interface circuit; and a non-volatile memory device, wherein said controller receives data and commands from outside of said non-volatile memory system via said interface circuit, wherein said commands includes a first write command and a second write command, wherein said non-volatile memory device comprises a plurality of word lines, a plurality of data lines, a plurality of non-volatile memory cells and a data latch circuit, wherein each of said non-volatile memory cells is placed at a cross-point of a corresponding word line and a corresponding data line and has a threshold voltage within at least three threshold voltage ranges, one of which threshold voltage ranges is erase state and the others of which are program states, wherein said non-volatile memory device stores said data received by said controller to said data latch circuit, selects one of said word lines and stores said stored data in said data latch circuit to ones of non-volatile memory cells connected to said selected word line, when said controller receives said first write command, and wherein said non-volatile memory device selects one of said word lines, reads data from ones of said non-volatile memory cells connected to said selected word line to said data latch circuit, stores said data received by said controller to said data latch circuit and stores said stored data in said data latch circuit into said ones of non-volatile memory cells connected to said selected word line, when said controller receives said second write command, and wherein said data latch circuit is read and stores data indicating of erase state before storing said data received by said controller.

6. A non-volatile memory system according to claim 1, wherein said non-volatile memory device further comprises a verify circuit, and wherein said non-volatile memory device erases data stored in said ones of non-volatile memory and stores said stored data in said data latch circuit into said ones of non-volatile memory cells again, when said verify circuit detects that said threshold voltage of at least one non-volatile memory cell is out of a threshold voltage distribution that correspond to having to stored data in said non-volatile memory cell after storing data in said ones of non-volatile memory cells.

7. A non-volatile memory system according to claim 6, wherein said non-volatile memory device erases data stored in said ones of non-volatile memory cells before storing said data into said ones of non-volatile memory cells.

8. A non-volatile memory system comprising:

a controller;

a non-volatile memory device; and an interface circuit, wherein said controller receives data from outside of said non-volatile memory system via said interface circuit, wherein said non-volatile memory device comprises a plurality of non-volatile memory cells and a data latch circuit including a plurality of data latches, each of which non-volatile memory cells stores data as a threshold voltage within a plurality of threshold voltage distributions in which one of said distributions indicates an erase status and the other two indicate a program status, and wherein said non-volatile memory device selects ones of said non-volatile memory cells, reads data from said selected ones of said non-volatile memory cells to said data latch circuit, stores said received data in ones of said data latches which ones of said data latches stores data corresponding to said threshold voltage indicating said erase status, and stores data stored in said data latch circuit into said selected ones of said non-volatile memory cells, when said controller supplies a first command to said non-volatile memory device.

* * * * *